US011321177B2

(12) United States Patent
Kim et al.

(10) Patent No.: US 11,321,177 B2
(45) Date of Patent: May 3, 2022

(54) MEMORY DEVICE AND MEMORY MODULE INCLUDING SAME

(71) Applicant: SAMSUNG ELECTRONICS CO., LTD., Suwon-si (KR)

(72) Inventors: Minsu Kim, Seongnam-si (KR); Nam Hyung Kim, Suwon-si (KR); Dae-Jeong Kim, Seoul (KR); Do-Han Kim, Hwaseong-si (KR); Deokho Seo, Suwon-si (KR); Wonjae Shin, Seoul (KR); Yongjun Yu, Suwon-si (KR); Changmin Lee, Hwaseong-si (KR); Insu Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/108,331

(22) Filed: Dec. 1, 2020

(65) Prior Publication Data

US 2021/0374001 A1 Dec. 2, 2021

(30) Foreign Application Priority Data

May 27, 2020 (KR) ........................ 10-2020-0063542

(51) Int. Cl.
*G06F 11/10* (2006.01)
*G11C 11/4091* (2006.01)
*G11C 11/408* (2006.01)

(52) U.S. Cl.
CPC ...... *G06F 11/1076* (2013.01); *G11C 11/4085* (2013.01); *G11C 11/4087* (2013.01); *G11C 11/4091* (2013.01)

(58) Field of Classification Search
CPC .................................................. G11C 11/4085
USPC .................................. 714/764, 765, 768, 769
See application file for complete search history.

(56) References Cited

U.S. PATENT DOCUMENTS

| | | |
|---|---|---|
| 4,807,195 A | 2/1989 | Busch et al. |
| 6,839,266 B1 | 1/2005 | Garrett, Jr. et al. |
| 7,234,099 B2 | 6/2007 | Gower et al. |
| 8,069,377 B2 | 11/2011 | Singh |
| 8,806,298 B2 | 8/2014 | Bains |
| 9,455,038 B2 | 9/2016 | Tuers et al. |
| 9,817,714 B2 | 11/2017 | Halbert et al. |
| 9,824,776 B1* | 11/2017 | Kim ........................ G11C 29/40 |
| 9,842,021 B2 | 12/2017 | Halbert et al. |
| 10,048,888 B2 | 8/2018 | Willcock et al. |
| 10,318,365 B2 | 6/2019 | Li et al. |
| 2013/0163351 A1* | 6/2013 | Kim .................... G11C 11/4087 |
| | | 365/189.15 |

(Continued)

*Primary Examiner* — Fritz Alphonse
(74) *Attorney, Agent, or Firm* — Volentine, Whitt & Francos, PLLC

(57) ABSTRACT

A memory device includes a peripheral circuit communicating with memory banks. Each of the banks includes a memory cell array including memory cells, a row decoder connected with the memory cells through word lines, bit line sense amplifiers connected with the memory cells through bit lines including first bit lines and second bit lines, and a column decoder configured to connect the bit line sense amplifiers with the peripheral circuit. The memory cell array includes a first section connected with the first bit lines and a second section connected with the second bit lines, and the first section and second section are independent of each other with regard to a row-dependent error.

20 Claims, 24 Drawing Sheets

(56) References Cited

U.S. PATENT DOCUMENTS

| | | | |
|---|---|---|---|
| 2014/0059277 A1 | 2/2014 | Chung | |
| 2014/0140124 A1* | 5/2014 | Kang | G11C 11/1673 |
| | | | 365/148 |
| 2016/0019910 A1* | 1/2016 | Faubel | G10L 25/18 |
| | | | 704/209 |
| 2020/0371873 A1* | 11/2020 | Schaefer | H03M 13/2909 |
| 2021/0158856 A1* | 5/2021 | Wang | G11C 11/4097 |

* cited by examiner

FIG. 6

| | DQ1 | DQ2 | DQ3 | DQ4 | DQ5 | DQ6 | DQ7 | DQ8 |
|---|---|---|---|---|---|---|---|---|
| BL0 | | | | | | | | |
| BL1 | | | | | | | | |
| BL2 | | | | | | | | |
| BL3 | | | | | | | | |
| BL4 | | | | | | | | |
| BL5 | | | | | | | | |
| BL6 | | | | | | | | |
| BL7 | | | | | | | | |
| BL8 | | | | | | | | |
| BL9 | | | | | | | | |
| BL10 | | | | | | | | |
| BL11 | | | | | | | | |
| BL12 | | | | | | | | |
| BL13 | | | | | | | | |
| BL14 | | | | | | | | |
| BL15 | | | | | | | | |

| | DQ1 | DQ2 | DQ3 | DQ4 | DQ5 | DQ6 | DQ7 | DQ8 |
|---|---|---|---|---|---|---|---|---|
| BL0 | | | | | | | | |
| BL1 | | | | | | | | |
| BL2 | | | | | | | | |
| BL3 | | | | | | | | |
| BL4 | | | | | | | | |
| BL5 | | | | | | | | |
| BL6 | | | | | | | | |
| BL7 | | | | | | | | |
| BL8 | | | | | | | | |
| BL9 | | | | | | | | |
| BL10 | | | | | | | | |
| BL11 | | | | | | | | |
| BL12 | | | | | | | | |
| BL13 | | | | | | | | |
| BL14 | | | | | | | | |
| BL15 | | | | | | | | |

| DT | DT | DT | DT | C\|C\|C\|C<br>P\|P\|P\|P |
|---|---|---|---|---|
| 1121 | 1122 | 1123 | 1124 | 1125 |

FIG. 9

|  | DQ1 | DQ2 | DQ3 | DQ4 | DQ5 | DQ6 | DQ7 | DQ8 |
|---|---|---|---|---|---|---|---|---|
| BL0 | | | | | | | | |
| BL1 | | | | | | | | |
| BL2 | | | | | | | | |
| BL3 | | | | | | | | |
| BL4 | | | | | | | | |
| BL5 | | | | | | | | |
| BL6 | | | | | | | | |
| BL7 | | | | | | | | |
| BL8 | | | | | | | | |
| BL9 | | | | | | | | |
| BL10 | | | | | | | | |
| BL11 | | | | | | | | |
| BL12 | | | | | | | | |
| BL13 | | | | | | | | |
| BL14 | | | | | | | | |
| BL15 | | | | | | | | |

DT1 (rows BL0–BL7), DT2 (rows BL8–BL15)

FIG. 10

|  | DQ1 | DQ2 | DQ3 | DQ4 | DQ5 | DQ6 | DQ7 | DQ8 |  |
|---|---|---|---|---|---|---|---|---|---|
| BL0 |  |  |  |  |  |  |  |  |  |
| BL1 |  |  |  |  |  |  |  |  |  |
| BL2 |  |  |  |  |  |  |  |  | —C1 |
| BL3 |  |  |  |  |  |  |  |  |  |
| BL4 |  |  |  |  |  |  |  |  |  |
| BL5 |  |  |  |  |  |  |  |  |  |
| BL6 |  |  |  |  |  |  |  |  | —C2 |
| BL7 |  |  |  |  |  |  |  |  |  |
| BL8 |  |  |  |  |  |  |  |  |  |
| BL9 |  |  |  |  |  |  |  |  |  |
| BL10 |  |  |  |  |  |  |  |  | —P1 |
| BL11 |  |  |  |  |  |  |  |  |  |
| BL12 |  |  |  |  |  |  |  |  |  |
| BL13 |  |  |  |  |  |  |  |  |  |
| BL14 |  |  |  |  |  |  |  |  | —P2 |
| BL15 |  |  |  |  |  |  |  |  |  |

FIG. 20

|      | DQ1 | DQ2 | DQ3 | DQ4 |
|------|-----|-----|-----|-----|
| BL0  |     |     |     |     |
| BL1  |     |     |     |     |
| BL2  |     |     |     |     |
| BL3  |     |     |     |     |
| BL4  |     |     |     |     |
| BL5  |     |     |     |     |
| BL6  |     |     |     |     |
| BL7  |     |     |     |     |
| BL8  |     |     |     |     |
| BL9  |     |     |     |     |
| BL10 |     |     |     |     |
| BL11 |     |     |     |     |
| BL12 |     |     |     |     |
| BL13 |     |     |     |     |
| BL14 |     |     |     |     |
| BL15 |     |     |     |     |

DTPC

FIG. 22

|      | DQ1 | DQ2 | DQ3 | DQ4 |
|------|-----|-----|-----|-----|
| BL0  |     |     |     |     |
| BL1  |     |     |     |     |
| BL2  |     |     |     |     |
| BL3  |     |     |     |     |
| BL4  |     |     |     |     |
| BL5  |     |     |     |     |
| BL6  |     |     |     |     |
| BL7  |     |     |     |     |
| BL8  |     |     |     |     |
| BL9  |     |     |     |     |
| BL10 |     |     |     |     |
| BL11 |     |     |     |     |
| BL12 |     |     |     |     |
| BL13 |     |     |     |     |
| BL14 |     |     |     |     |
| BL15 |     |     |     |     |

|      | DQ1 | DQ2 | DQ3 | DQ4 |
|------|-----|-----|-----|-----|
| BL0  |     |     |     |     |
| BL1  |     |     |     |     |
| BL2  |     |     |     |     |
| BL3  |     |     |     |     |
| BL4  |     |     |     |     |
| BL5  |     |     |     |     |
| BL6  |     |     |     |     |
| BL7  |     |     |     |     |
| BL8  |     |     |     |     |
| BL9  |     |     |     |     |
| BL10 |     |     |     |     |
| BL11 |     |     |     |     |
| BL12 |     |     |     |     |
| BL13 |     |     |     |     |
| BL14 |     |     |     |     |
| BL15 |     |     |     |     |

MEMORY DEVICE AND MEMORY MODULE INCLUDING SAME

CROSS-REFERENCE TO RELATED APPLICATIONS

This application claims priority under 35 U.S.C. § 119 to Korean Patent Application No. 10-2020-0063542 filed on May 27, 2020 in the Korean Intellectual Property Office, the subject matter of which is hereby incorporated by reference.

BACKGROUND

Embodiments of the inventive concept relate generally to semiconductor memory devices, and more particularly, to memory systems and memory devices providing an improved error correction function. Embodiments of the inventive concept relate to memory modules including at least one memory device providing an improved error correction function.

Memory devices may be variously configured to store data received from an external host device, and thereafter, provide the stored data in response to a request received from the external host device. Error(s) may occur when data is programmed (or written) to the memory device, while the data is stored in the memory device, and/or when the data is retrieved (or read) from the memory device.

One or more error(s) occurring in data may cause a system error or processing failure in the external host device using the data. To prevent such failures, the external host device may include a data integrity function capable of detecting and/or correcting error(s).

As the data integrity function provided by the external host device improves in its ability to detect and/or correct error(s), the probability of a system error or processing failure decreases. However, improved (or emerging) data integrity functions (e.g., data detection and/or correction functions) demand considerable memory system resources.

SUMMARY

Embodiments of the inventive concept provide a memory device having a structure supporting a function for correcting an error and, a memory module having an improved error correction function or capable of reducing the amount of resource necessary for error correction by including the memory device.

According to an embodiment, a memory device includes banks and a peripheral circuit configured to receive a command and an address from an external host device, transfer the command and the address to the banks, and communicate data between the external host device and the banks. Each of the banks includes a memory cell array including memory cells, a row decoder connected with the memory cells through word lines, bit line sense amplifiers connected with the memory cells through bit lines including first bit lines and second bit lines, and a column decoder configured to connect the bit line sense amplifiers with the peripheral circuit. The memory cell array includes a first section connected with the first bit lines and a second section connected with the second bit lines, and the first section and second section are independent of each other with regard to a row-dependent error.

According to an embodiment, a memory module includes; first memory devices, a second memory device, a driver configured to receive a command and an address from an external host device, and transfer the command and the address to the first memory devices and the second memory device, and a power management circuit configured to receive an external power signal from the external host device, generate an internal power signal from the external power signal, and provide the internal power signal to at least one of the first memory devices, the second memory device and the driver. Each of the first memory devices and the second memory device is configured to communicate data with the external host device in accordance with a burst length, and each of the first memory devices and the second memory device respectively provides two error-independent coverages with regard to the burst length.

According to an embodiment, a memory device includes a memory module includes; eight (8) first memory devices, a second memory device, a driver configured to receive a command and an address from an external host device, and transfer the command and the address to the first memory devices and the second memory device, and a power management circuit configured to receive an external power signal from the external host device, generate an internal power signal from the external power signal, and provide the internal power signal to at least one of the first memory devices, the second memory device and the driver. Each of the first memory devices and the second memory device is configured to communicate data with the external host device in accordance with a burst length. Each of the first memory devices and the second memory device provides at least two error-independent coverages with regard to the burst length, and the second memory device is configured to store cyclic redundancy code and parity for correcting an error in data stored in at least one of the eight (8) first memory devices.

BRIEF DESCRIPTION OF THE DRAWINGS

The above and other objects and features of the inventive concept may be better understood upon consideration of the detailed description that follows, taken together with the accompanying drawings.

FIG. 6, 7, 9, 10, are respective, conceptual diagrams variously illustrating examples of data blocks that may be used to communicate data or error correction code with an external host device.

FIGS. 8 and 11 are respective, conceptual diagrams illustrating examples of data blocks including data, cyclic redundancy code and a parity of first memory devices associated with a first channel of a memory module.

FIGS. 20, 21, 22, 23, 24 and 25 are respective, conceptual diagrams illustrating in various examples data block(s) that may be used to communicate data and/or error correction code in the computing system of FIG. 19.

DETAILED DESCRIPTION

Below, embodiments of the inventive concept may be described in detail and clearly to such an extent that an ordinary one in the art easily implements the inventive concept.

Figure 1:
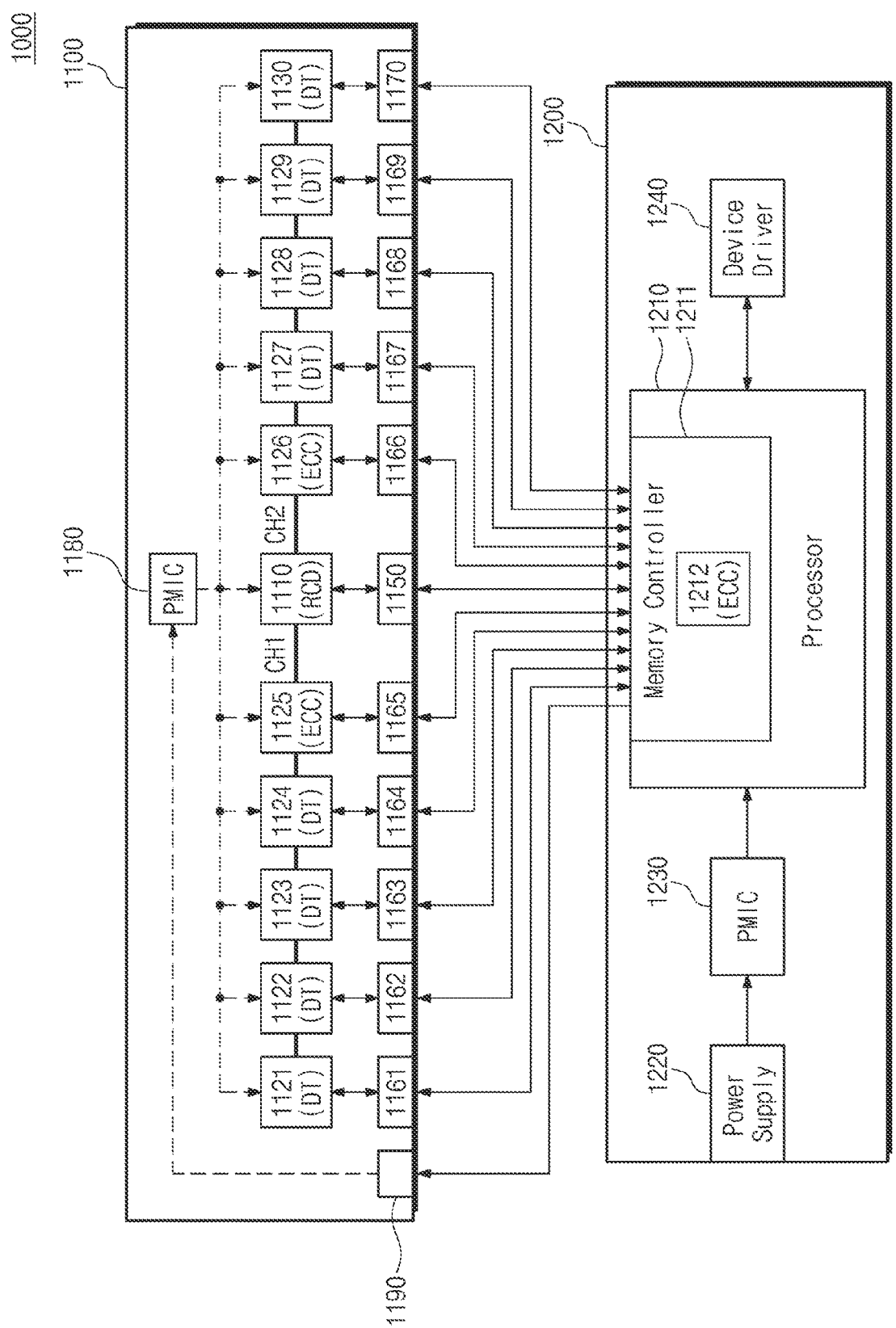
FIG. 1 is a block diagram illustrating a computing system according to embodiments of the inventive concept.

Figure (FIG.) 1 is a block diagram illustrating a computing system 1000 according to embodiments of the inventive concept. Referring to FIG. 1, the computing system 1000 may include a memory module 1100 and an external host device 1200.

The memory module 1100 may include a driver 1110, first memory devices 1121 to 1125, second memory devices 1126 to 1130, a driver connector 1150, first memory connectors 1161 to 1165, second memory connectors 1166 to 1170, a power management circuit 1180 and a power connector 1190.

The driver 1110 may communicate various signals with the external host device 1200 through the driver connector 1150. For example, the driver 1110 may variously transmit and/or receive (hereafter, "communicate") data signal(s) (DQ), command(s) (CMD), address(es) (ADDR), clock signal(s) (CK), control signal(s) (e.g., CTRL, DQS), etc., with the external host device 1200. (See, e.g., FIG. 2).

For example, the driver 1110 may receive various unidirectional signal(s) from the external host device 1200, exchange various bidirectional signal(s) with the external host device 1200, and/or transmit various unidirectional signal(s) to the external host device 1200.

Additionally, the driver 1110 may transmit command signal(s) CMD and/or address(es) ADDR to the first memory devices 1121 to 1125 through a first channel CH1 and/or transmit control signal(s) CTRL received from the external host device 1200 to the first memory devices 1121 to 1125 through the first channel CH1.

The driver 1110 may also transmit control signals received from the first memory devices 1121 to 1125 through the first channel CH1 to the external host device 1200. Here, the control signals CTRL communicated by the driver 1110 with the external host device 1200 may the same, partially the same, or different from the control signals communicated by the driver 1110 with the first memory devices 1121 to 1125.

The foregoing description related to the driver 1110, first memory devices 1121 to 1125 and the first channel CH1, may be similarly applied to the driver 1110, the second memory devices 1126 to 1130 and a second channel CH2.

In some embodiments, the driver 1110 may be a register clock driver (RCD) defined in accordance with one or more technical standard(s) associated with Dual In-line Memory Module(s) (DIMMs), such as the dual data rate fifth-generation synchronous dynamic random access memory (DDR5 SRAM) DIMM.

The first memory devices 1121 to 1125 may communicate with the external host device 1200 through the first memory connectors 1161 to 1165. For example, the first memory devices 1121 to 1125 may communicate data signals DQ and data strobe signals DQS with the external host device 1200. (See, e.g., FIG. 2).

The second memory devices 1126 to 1130 may communicate with the external host device 1200 through the second memory connectors 1166 to 1170. For example, the second memory devices 1126 to 1130 may communicate the data signals DQ and the data strobe signals DQS with the external host device 1200.

In some embodiments, the first memory devices 1121 to 1125 and the second memory devices 1126 to 1130 may be a DDR5 SDRAM. Accordingly, the first memory devices 1121 to 1125 and the second memory devices 1126 to 1130 may communicate with the external host device 1200 using a protocol defined in accordance with one or more technical standard(s) associated with DIMMs, such as the DDR5 SDRAM DIMM.

Depending on a request of the external host device 1200, the first memory devices 1121 to 1125 and the second memory devices 1126 to 1130 may simultaneously (e.g., at least partially overlapping in time) receive the data signals DQ and may write the received data signals DQ. Depending on a request of the external host device 1200, the first memory devices 1121 to 1125 and the second memory devices 1126 to 1130 may simultaneously read the data signals DQ and may write the read data signals DQ.

The first memory devices 1121 to 1125 and the second memory devices 1126 to 1130 may sequentially receive, or may sequentially transmit the data signals DQ in accordance with a defined burst length BL. For example, according to standard(s) associated with the DDR5 SDRAM DIMM, a burst length BL of 16 may be used.

In some embodiments, the number of data signals DQ of the DDR5 SDRAM may decrease, as compared with legacy memory device(s)—e.g., the DDR4 SDRAM and older DDR memory devices. In contrast, the external host device 1200 may be configured to communicate the data signals DQ of 64 bytes with one memory device. To support compatibility of 64 bytes, the first memory devices 1121 to 1125 and the second memory devices 1126 to 1130 may be configured to have the burst length BL of 16.

That is, in response to one write request or one read request received from the external host device 1200, the first memory devices 1121 to 1125 and the second memory devices 1126 to 1130 may continuously receive the data signals DQ over 16 time periods or may continuously transmit the data signals DQ over 16 time periods. In some embodiments, each of the first memory devices 1121 to 1125 and each of the second memory devices 1126 to 1130 may be an (×8) memory device capable of communicating eight (8) data signals DQ with the external host device 1200.

The power management circuit 1180 may receive one or more external power signal(s) from the external host device 1200 through the power connector 1190. The power management circuit 1180 may then generate one or more internal power signal(s) from the one or more external power signal(s), and variously provide the one or more internal power signal(s) to the driver 1110, the first memory devices 1121 to 1125 and/or the second memory devices 1126 to 1130.

In some embodiments, the power management circuit 1180 may be a power management integrated circuit (PMIC) designed in accordance with one or more technical standard(s) associated with the DDR5 SDRAM DIMM. In the illustrated example of FIG. 1, the memory module 1100 is assumed to be a registered DIMM (RDIMM). Alternately, however, the memory module 1100 may be an unbuffered DIMM (UDIMM), a load reduced DIMM (LRDIMM), or a fully buffered DIMM (FBDIMM). In this regard, those skilled in the art will recognize that differently configured memory modules may vary in constituent components and functions, as compared with standard-complying DIMMs (e.g., a RDIMM).

The external host device 1200 may include a processor 1210, a power supply 1220, a host power management circuit 1230, and a device driver 1240. The processor 1210 may include a general-purpose processor such as a central processing unit (CPU), and a special purpose processor such as an application processor (AP), a graphic processing unit (GPU), a neuromorphic processor (NP), or a neuromorphic processor.

The processor 1210 may include a memory controller 1211. The memory controller 1211 may control the memory module 1100 and may communicate with the memory module 1100. The communication with the external host device 1200 described with reference to the memory module 1100 may be performed by the memory controller 1211.

The memory controller 1211 may include an error correction circuit (ECC) 1212. The ECC 1212 may be configured to generate an error correction code. When the memory controller 1211 writes data DT into the memory module 1100, the memory controller 1211 may generate the error correction code for error correction from the data DT.

The memory controller 1211 may write the data DT to the first memory devices 1121 to 1124 (hereinafter, "first memory devices for data") being a part of the first memory devices 1121 to 1125, and may write the error correction code to the first memory device 1125 (hereinafter, "first memory device for ECC") being the remaining memory device of the first memory devices 1121 to 1125.

The memory controller 1211 may write the data DT to the second memory devices 1127 to 1130 (hereinafter, "second memory devices for data") being a part of the second memory devices 1126 to 1130, and may write the error correction code to the second memory device 1126 (hereinafter, "second memory device for ECC") being the remaining memory device of the second memory devices 1126 to 1130.

In some embodiments, the error correction code may include a cyclic redundancy code "C" for detecting an error, and parity information "P" (hereafter, "parity") for correcting the detected error. (See, e.g., FIG. 7). The memory controller 1211 may read the data DT and the error correction code from the memory module 1100 and perform error detection and correction functions.

The power supply 1220 of the external host device 1200 may generate power required to variously drive the computing system 1000. The power may be provided to the host power management circuit 1230. The host power management circuit 1230 may generate an internal power necessary to drive the external host device 1200. The host power management circuit 1230 may be a PMIC that is designed and manufactured depending on a system demand of the external host device 1200. The host power management circuit 1230 may supply the internal power to the processor 1210 and components of the external host device 1200.

The device driver 1240 may control various additional devices under control of the processor 1210. For example, the device driver 1240 may be connected with various devices such as a storage device, a modem, and a user interface device and may arbitrate the communication between the various devices and the processor 1210.

Here, the number of first memory devices 1121 to 1125 and the number of second memory devices 1126 to 1130 may vary by design and are not limited to only the illustrated examples of FIG. 1.

Figure 2:
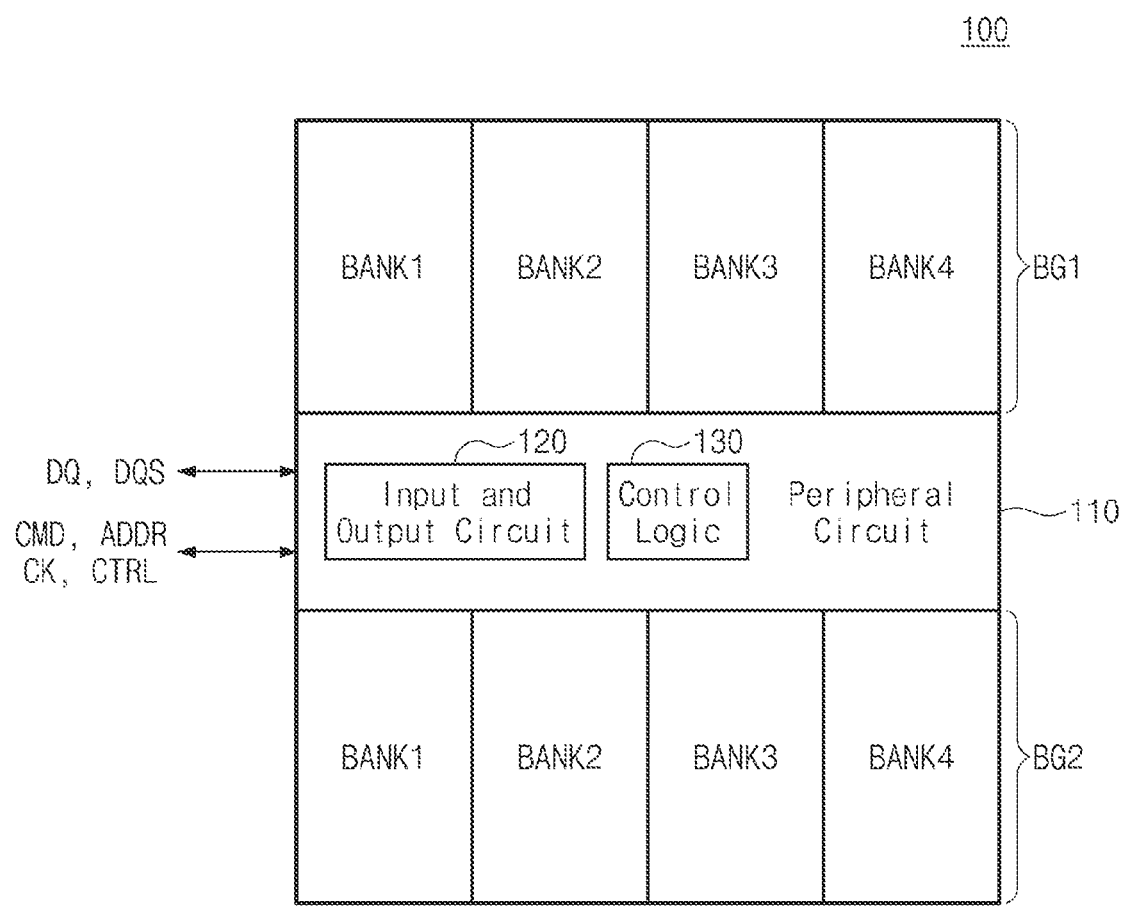
FIG. 2 is a block diagram further illustrating in one example a memory device 100 according to embodiments of the inventive concept

FIG. 2 is a block diagram further illustrating in one example a memory device 100 according to embodiments of the inventive concept. Here, the exemplary memory device 100 may correspond to one of the first memory devices 1121 to 1125 and/or one of the second memory devices 1126 to 1130 of FIG. 1. In some embodiments, the first memory devices 1121 to 1125 and the second memory devices 1126 to 1130 may have the same structure and/or configuration, and may perform one or more of the same operation(s).

Referring to FIGS. 1 and 2, the memory device 100 may include a first bank group BG1 and a second bank group BG2, wherein the first bank group BG1 includes first to fourth banks BANK1 to BANK4, and the second bank group BG2 includes first to fourth banks BANK1 to BANK4. Here, in some embodiments, each memory bank group and each bank may respectively have the same structure and may perform the same operation(s).

Each of the first to fourth banks BANK1 to BANK4 may include a plurality of memory cells, wherein the memory cells may be used to store the data DT and/or the error correction code communicated with the external host device 1200.

The memory device 100 of FIG. 2 further includes a peripheral circuit 110 capable of variously communicating data signal(s) DQ and DQS, control signal(s) CTRL, address(es) ADDR, and/or clock signal(s) CK with the external host device 1200. In some embodiments, the peripheral circuit 110 may select a bank according to a received address ADDR from among the first to fourth banks BANK1 to BANK4 of the first bank group BG1 and/or the second bank group BG2.

The peripheral circuit 110 may then control the selected bank such that an operation indicated by the received command CMD (e.g., a write operation or a read operation) is performed on memory cells indicated by the received address ADDR from among the memory cells of the selected bank. The peripheral circuit 110 may then communicate data signals DQ and/or data strobe signals DQS with the external host device 1200, wherein the data strobe signals DQS may be used to control latch timing for the data signals DQ.

The peripheral circuit 110 may include an input and output circuit 120 configured to exchange the data signals DQ and the data strobe signals DQS with the external host device 1200. The peripheral circuit 110 may further include control logic 130 configured to control the selected bank in response to the command CMD, the address ADDR, the clock signal CK, and the control signals CTRL.

The number of bank groups, as well as the number of banks within each bank group may vary with design and is not limited to only the illustrated example of FIG. 2.

Figure 3:
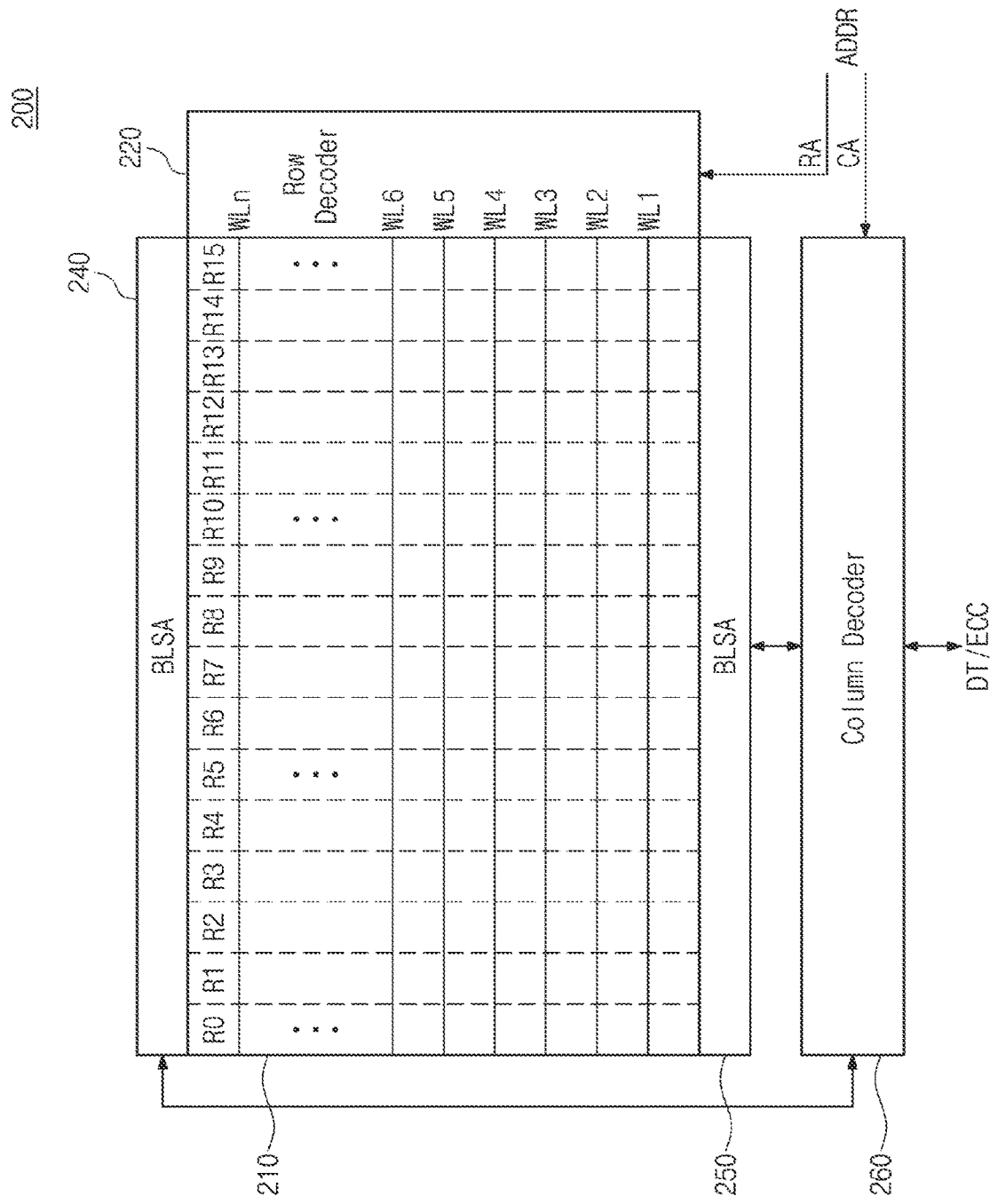
FIG. 3 is a block diagram further illustrating in one example a bank 200 according to embodiments of the inventive concept.

FIG. 3 is a block diagram further illustrating in one example a bank 200 according to embodiments of the inventive concept. Here, the bank 200 may correspond to be one of the first to fourth banks BANK1 to BANK4 of the first bank group BG1 and/or the second bank group BG2 of FIG. 2.

Referring to FIGS. 1, 2 and 3, the bank 200 may include a memory cell array 210, a row decoder 220, a first bit line sense amplifier (BLSA) 240, a second bit line sense amplifier 250 and a column decoder 260.

The memory cell array 210 may include memory cells arranged along a row direction and a column direction. The memory cell array 210 may include 0-th to 15-th regions R0 to R15, wherein, collectively, the 0-th to 15-th regions, R0 to R15 may correspond (e.g.,) to a burst length BL of 16. However, assuming a burst length BL of 8, the number of regions of the memory cell array 210 may be 8, and assuming a burst length BL of 32, the number of regions of the memory cell array 210 may be 32, as examples.

The row decoder 220 may be connected with memory cells in rows through word lines WL1 to WLn (where 'n' is a positive integer). The row decoder 220 may receive a row address RA of the address ADDR and may select one of the 1-st to n-th word lines WL1 to WLn in response to the row address RA. For example, the row decoder 220 may apply a voltage for activation (e.g., a positive voltage) to the selected word line.

The first bit line sense amplifier 240 and the second bit line sense amplifier 250 may be connected with memory cells in columns through bit lines. Bit lines connected with the first bit line sense amplifier 240 may be different from bit lines connected with the second bit line sense amplifier 250. For example, the first bit line sense amplifier 240 may be connected with even-numbered (or odd-numbered) bit lines along the row direction, and the second bit line sense amplifier 250 may be connected with odd-numbered (or even-numbered) bit lines along the row direction.

The first bit line sense amplifier 240 and the second bit line sense amplifier 250 may apply voltages to the bit lines or may sense voltages of the bit lines. By adjusting or sensing voltages of the bit lines, the first bit line sense amplifier 240 and the second bit line sense amplifier 250 may perform the write operation or the read operation on memory cells of the selected row.

The column decoder 260 may receive a column address CA of the address ADDR. The column decoder 260 may electrically connect a part of the bit lines with the peripheral circuit 110 in response to the column address CA. In some embodiments, the column decoder 260 may output the data DT or the error correction code ECC corresponding to the burst length BL of 16 by sequentially selecting the 0-th to 15-th regions R0 to R15 and outputting data read from memory cells of the sequentially selected regions.

For example, the memory cell array 210 of FIG. 3 is assumed to include the 0-th to 15-th regions R0 to R15. However, the memory cell array 210 may include a plurality of sub-arrays, and each sub-array may include the 0-th to 15-th regions R0 to R15. During the write operation or the read operation, one of a plurality of sub-arrays may be selected, and the write operation or the read operation may be performed in the 0-th to 15-th regions R0 to R15 in the selected sub-array in units of the burst length BL.

In the illustrated embodiment of FIG. 3, it is assumed that the column decoder 260 is included in the bank 200. However, the column decoder 260 may be included in the peripheral circuit 110, not the bank 200. In the case where the column decoder 260 is included in the peripheral circuit 110, the column decoder 260 may control an input or an output of the data DT or the error correction code ECC associated with one bank selected from the first to fourth banks BANK1 to BANK4 of the first bank group BG1 and the second bank group BG2. That is, the column decoder 260 may be applied in common to the first to fourth banks BANK1 to BANK4 of the first bank group BG1 and the second bank group BG2.

Figure 4:
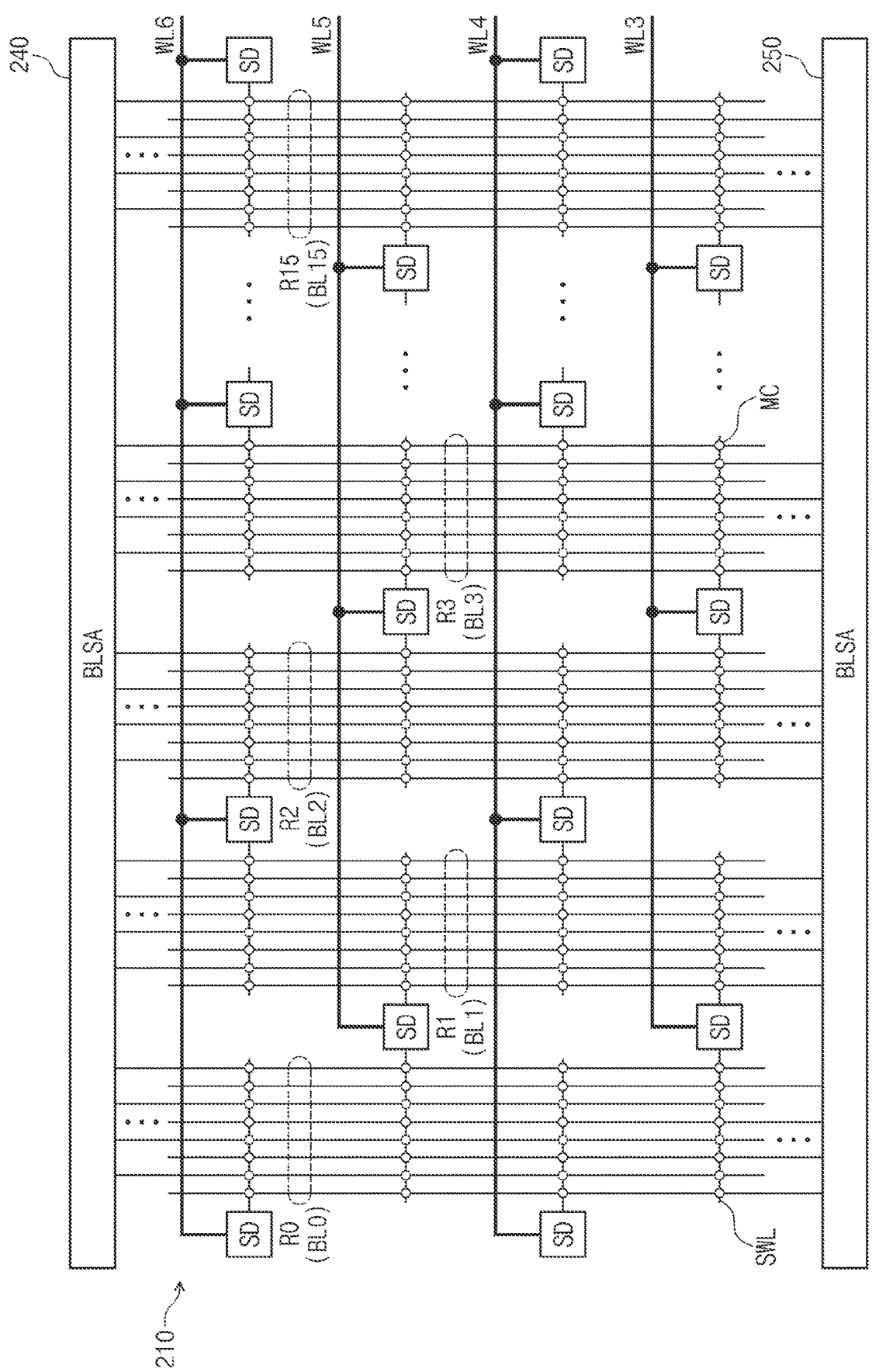
FIG. 4 is a conceptual diagram further illustrating in relevant portion the memory cell array of FIG. 3.

FIG. 4 is a conceptual diagram illustrating, in relevant portion, the memory cell array 210 of FIG. 3. Referring to FIGS. 1, 2, 3 and 4, the memory cell array 210 may include memory cells MC (marked as small white circles). The memory cells MC may be connected with sub-word line drivers SD through sub-word lines SWL. The sub-word line drivers SD may be connected with word lines, for example, the third to sixth word lines WL3 to WL6.

The 0-th to 15-th regions R0 to R15 may respectively correspond to timing periods associated with a burst length of 16. That is, memory cells of the 0-th region R0 may correspond to 0-th data communicated in a 0-th burst length BL0 of the 16 burst lengths BL, memory cells of the 1-st first region R1 may correspond to 1-st data communicated in a 1-st burst length BL1 of the 16 burst lengths BL, etc. Accordingly, the 0-th to 15-th regions R0 to R15 may be said to correspond to the 0-th to 15-th burst lengths BL0 to BL15, respectively.

In the 0-th region R0, the memory cells MC corresponding to the fourth word line WL4 and the sixth word line WL6 may be connected with sub-word lines placed on the right of the corresponding sub-word line drivers SD. The memory cells MC corresponding to the third word line WL3 and the fifth word line WL5 may be connected with sub-word lines placed on the left of the corresponding sub-word line drivers SD.

During the write operation or the read operation, at least one of the sub-word line drivers SD (or sub-word lines SWL) connected with a selected word line may also be selected. The write operation or the read operation may be performed on the memory cells MC connected with sub-word lines SWL connected with at least one selected sub-word line driver SD or on the memory cells MC connected with at least one selected sub-word line SWL.

In some embodiments, decoding lines for selecting at least one of sub-word line drivers SD connected with a selected word line, or at least one of sub-word lines SWL may be further provided. The decoding lines may be controlled by the row decoder 220 in response to the row address RA. Hereafter, the decoding lines will be omitted from the drawings for clarity.

Thus, the sub-word line drivers SD connected with the third to sixth word lines WL3 to SW6 may be disposed, in turn, on the left and the right of the 0-th region R0 along the column direction. Likewise, in each of the 1-st to 15-th regions R1 to R15, the sub-word line drivers SD may be disposed, in turn, on the left and the right of the corresponding region along the column direction.

In each of the 0-th to 15-th regions R0 to R15, the first bit line sense amplifier 240 may be connected with even-numbered bit lines. In each of the 0-th to 15-th regions R0 to R15, the second bit line sense amplifier 250 may be connected with odd-numbered bit lines.

In some embodiments, eight (8) memory cells MC may be connected with one sub-word line SWL. Memory cells MC connected with one sub-word line SWL may be simultaneously written to, or simultaneously read from. That is, the memory device 100 may receive or transmit eight (8) data signals DQ (e.g., eight (8) bits) at a time.

In some embodiments, a plurality of memory cell groups may be connected with one sub-word line SWL. Each of the plurality of memory cell groups may include memory cells MC corresponding to the number of data signals DQ that the memory device 100 simultaneously receives or transmits (e.g., eight (8) memory cells MC).

During the write operation or the read operation, one of the plurality of memory cell groups connected with one sub-word line SWL may be selected, and the write operation or the read operation may be performed on memory cells of the selected memory cell group.

Figure 5:
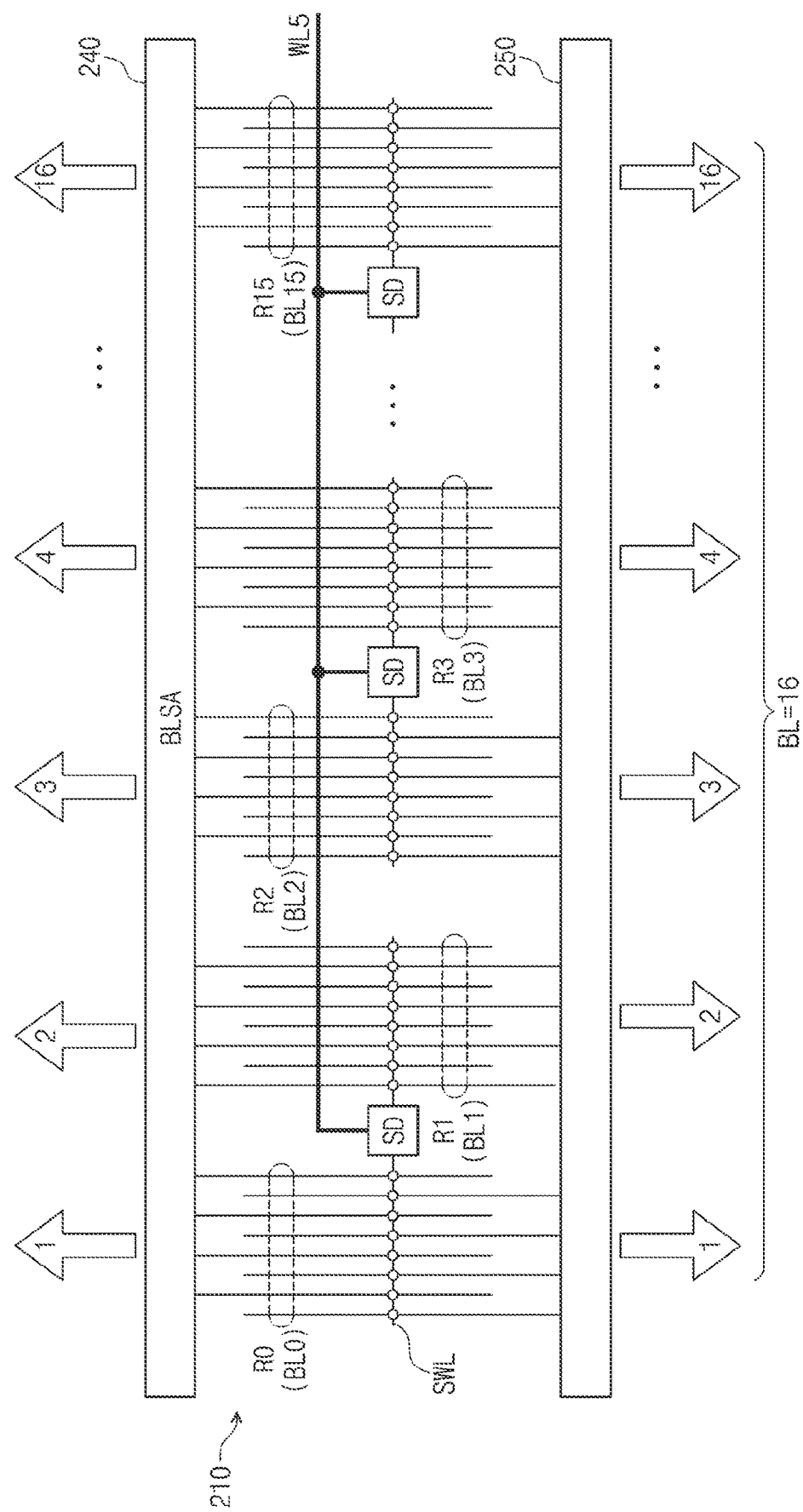
FIG. 5 is a conceptual diagram illustrating an example in which data or error correction code is read from a memory cell array during a read operation.

FIG. 5 is a conceptual diagram illustrating an example in which data DT or error correction code ECC is read from the memory cell array 210 during a read operation. Referring to FIGS. 1 and 5, it is assumed that the word line WL5 has been selected.

During (a period of time corresponding to) the 0-th burst length BL0, the data DT or the error correction code ECC may be read from the memory cells MC in the 0-th region R0 using the first bit line sense amplifier 240 and the second bit line sense amplifier 250. The data DT or the error correction code ECC thus read may be simultaneously transmitted from the memory device 100 as the data signals DQ.

Thereafter, during the 1-st to 15-th burst lengths BL1 to BL15, the data DT or the error correction code ECC may be respectively read from the first to 15-th regions R1 to R15, and the resulting data DT or the error correction code ECC may be simultaneously transmitted from the memory device 100 as the data signals DQ.

Extending the assumptions described above, for example, the memory device 100 may transmit eight (8) data signals (e.g., data bits) DQ during sixteen (16) consecutive time periods corresponding to the entire burst length of 16.

The write operation may be similarly performed, except the memory device 100 receives a sequence of data signals DQ instead of transmitting the sequence of data signals DQ. In this manner, data DT or the error correction code ECC may be written to the memory cells MC.

FIG. 6 is a conceptual diagram illustrating an example of a data block that may be used to exchange data between each of the first memory devices for data 1121 to 1124 and the second memory devices for data 1127 to 1130 and the external host device 1200. Referring to FIGS. 1 to 6, it is assume that the memory device 1100 simultaneously receives or transmits first to eighth data signals DQ1 to DQ8.

Thus, the memory device 1100 may continuously receive or transmit the first to eighth data signals DQ1 to DQ8 during a number of time periods corresponding to the number of 0-th to 15-th burst lengths BL0 to BL15, here again assuming a burst length of 16. Under such assumptions, the data block of FIG. 6 may be understood as a unit in which the memory device 100 exchanges data DT with the external host device 1200, including (e.g.,) 128 bits.

Further, continuing with the previous assumption that the memory module 1100 includes the four (4) first memory devices for data 1121 to 1124 and the four (4) second memory devices for data 1127 to 1130, the memory module 1100 may exchange data DT with the external host device 1200 in units of 1024 bits.

FIG. 7 is a conceptual diagram illustrating another example of a data block that may be used to exchange data between the first memory device for ECC 1125 and the second memory device for ECC 1126 with the external host device 1200. The data block (e.g., 128 bits) of FIG. 6 is, here again, assumed as an example. However, in the illustrated example of FIG. 7, half of the 128 bit data block (e.g., a first half corresponding to the 0-th to 7-th burst lengths BL0 to BL7) may be used to communicate cyclic redundancy code "C". Further, the other half of the 128 bit data block (e.g., a second half corresponding to the 8-th to 15-th burst lengths BL8 to BL15) may be used to communicate parity "P".

In this manner, the first memory device for ECC 1125 and the second memory device for ECC 1126 of the memory module 1100 may communicate the error correction code ECC (including e.g., 256 bits) with the external host device 1200.

FIG. 8 is a conceptual diagram illustrating an example of five (5) data blocks including four (4) data block of data DT, one-half (½) of a block of cyclic redundancy code "C", and one-half (½) of a block of parity "P" communicated from the first memory devices 1121 to 1125 using the first channel CH1 of the memory module 1100. Data blocks of the second memory devices 1126 to 1130 of the second channel CH2 may be the same as those described with reference to FIG. 8, except for the respective locations of data blocks. Thus, referring to FIGS. 1 to 8, the first memory devices 1121 to 1125 of the first channel CH1 may communicate with the external host device 1200 in units of four (4) data blocks including the data DT, plus one (1) data block of error correction code ECC including (e.g.,) cyclic redundancy code "C" and parity "P".

Accordingly, in the foregoing example, data blocks of the first memory devices 1121 to 1125, a ratio of first memory devices for data (e.g., 1121 to 1124) and first memory device for ECC (e.g., 1125) is 4-to-1. And as a result, a RAS (Reliability, Availability, Serviceability) coverage for the first memory devices 1121 to 1130 of the memory module 1100 of FIG. 1—assuming x8 memory devices communicating eight (8) data signals DQ1 to DQ8—may be understood as a single error, correction double error detection (SECDED) type of device.

FIG. 9 is a conceptual diagram illustrating an example in which a data block corresponding to data DT provides two or more error-independent coverages. Referring to FIGS. 1, 2, 3 and 9, the term "coverage", as used in this context, may be understood as a subset of data blocks, wherein each data block is a unit in which the memory device 100 exchanges data DT with the external host device 1200. For example, the 0-th to 7-th burst lengths BL0 to BL7 may constitute a first coverage, and the 8-th to 15-th burst lengths BL8 to BL15 may constitute a second coverage, wherein the first coverage includes first data DT1 and the second coverage includes second data DT2.

With this configuration, as an example, an error occurring in the first coverage will not affect the second coverage, and an error occurring in the second coverage will not affect the first coverage. Hence, the first coverage and the second coverage may be said to be "error-independent coverages." As a result, and again extending the working assumptions above, the memory device 100 may be said to provide two error-independent coverages with respect to the burst length BL of 16. Those skilled in the art will also understand that more than two error-independent coverages may be provided with respect to burst lengths of arbitrary length in other embodiments of the inventive concept.

Referring again to FIG. 3, the 0-th to 15-th regions R0 to R15 respectively corresponding to the 0-th to 15-th burst lengths BL0 to BL15 may be arranged in a row direction. Accordingly, two or more error-independent coverages may correspond to two or more "sections"—independent of each other—with regard to a row-dependent error. Here, the term "section" denotes a subset within the memory cell array 210, wherein each section may include two or more regions of the 0-th to 15-th regions R0 to R15.

FIG. 10 is a conceptual diagram illustrating an example in which an exemplary (e.g., 128 bit) data block including cyclic redundancy code "C" and parity "P" may provide two or more error-independent coverages. Here, the 0-th to 7-th burst lengths BL0 to BL7 may constitute a first coverage and the 8-th to 15-th burst lengths BL8 to BL15 may constitute a second coverage.

Referring to FIGS. 1, 2, 3, 9, and 10, data blocks of the first memory devices for data 1121 to 1124 may be data blocks for data, and data blocks of the first memory device for ECC 1125 may be a data block for ECC. When the data blocks for data provide error-independent coverages, the external host device 1200 may independently perform error correction encoding/decoding on the error-independent coverages.

In this regard, the error correction encoding may generate the cyclic redundancy code "C" and the parity "P" from the data DT during a write operation. And during a read operation, the error correction decoding may detect error(s) in the read data DT using the cyclic redundancy code "C" and correct the detected error(s) using the parity "P".

As illustrated in FIG. 10, the data block for ECC may include first cyclic redundancy code C1 and first parity P1 for the first coverage of the data blocks for data, as well as second cyclic redundancy code C2 and second parity P2 for the second coverage of the data blocks for data.

For example, the data block for ECC of the first channel CH1 may include the first cyclic redundancy codes C1, the second cyclic redundancy codes C2, the first parities P1, and the second parities P2 corresponding to the data blocks for data of the first channel CH1. The data block for ECC of the second channel CH2 may include the first cyclic redundancy codes C1, the second cyclic redundancy codes C2, the first parities P1, and the second parities P2 corresponding to the data blocks for data of the second channel CH2.

Figure 11:
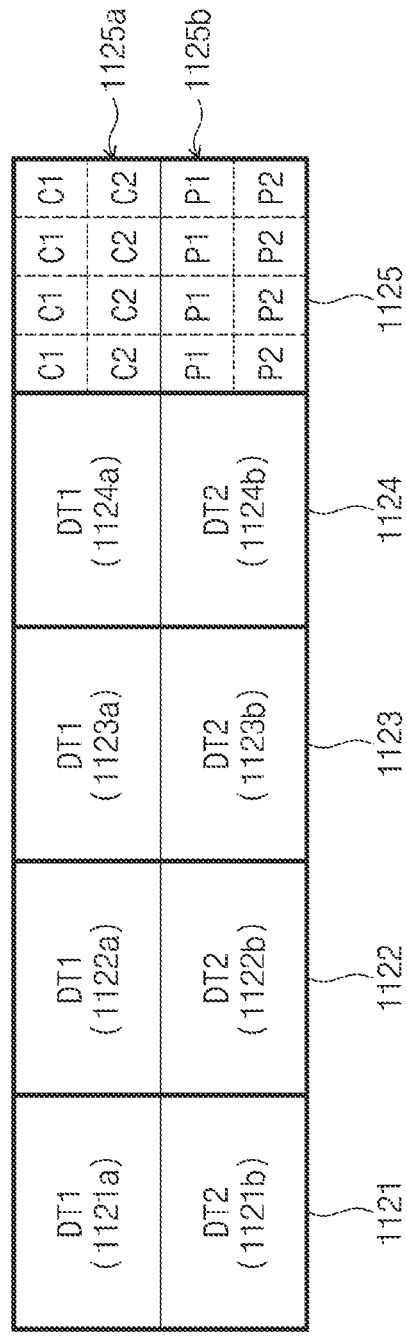

FIG. 11 is a conceptual diagram illustrating another example of data blocks of the first memory devices 1121 to 1125 corresponding to one channel (e.g., the first channel CH1) of the memory module 1100 of FIGS. 1, 2 and 3. Data blocks of the second memory devices 1126 to 1130 corresponding to another channel (e.g., the second channel CH2) may be the same as those described with reference to FIG. 11. except for the respective locations of the data blocks.

Referring to FIGS. 1, 2, 3, 9, 10 and 11, each of data blocks for data belonging to the first memory devices for data 1121 to 1124 may include first data DT1 and second data DT2 for each of first coverages 1121a to 1124a and second coverages 1121b to 1124b.

A first coverage 1125a of a data block for ECC belonging to the first memory device for ECC 1125 may include first cyclic redundancy codes C1 and second cyclic redundancy codes C2, respectively corresponding to the first data DT1, and second data DT2 of the first coverages 1121a to 1124a and second coverages 1121b to 1124b of the data blocks for data.

A second coverage 1125b of the data block for ECC belonging to the first memory device for ECC 1125 may include first parities P1 and second parities P2 respectively corresponding to the first data DT1 and the second data DT2 of the first coverages 1121a to 1124a and the second coverages 1121b to 1124b of the data blocks for data.

The first coverages 1121a to 1124a and the second coverages 1121b to 1124b are error-independent, and as a functional result, may be considered as independent, separate and distinct memories. Accordingly, a data range over which the memory controller 1211 is required to error correction encoding/decoding may effectively decreased.

Accordingly, as the memory controller 1211 maintains a desired performance level for error detection and/or correction, the amount of correspondingly required cyclic redundancy code and parity may be decreased. For example, when the amount of data of an error-dependent coverage is equal to the total amount of data of two coverages being error-independent of each other, the amount of error correction code required to maintain the same level of error detection and/or correction performance may be halved, since the two coverages are error-independent.

As illustrated in FIG. 11, the amount of cyclic redundancy code and the amount of parity may be the same. (Compare FIG. 8). Accordingly, the performance of error correction of the memory controller 1211 may be improved. For example, the RAS coverage for error-independent coverages of the memory module 1100 may be expanded to the single device data correction (SDDC).

As a data block may be implemented with two or more, error-independent coverages, and as memory cells may be divided into two independent sections with regard to the row-dependent error(s), the error correction capability of the memory module 1100 may be improved. An example of two (2) error-independent coverages and two (2) independent sections has been described above, but those skilled in the art will recognize from the foregoing that embodiments of the inventive concept may include examples having more than two coverages and/or more than two sections. In this regard, as the number of error-independent coverages and/or the number of independent sections increase, the error correction capability of the memory module 1100 may further improve.

Figure 12:
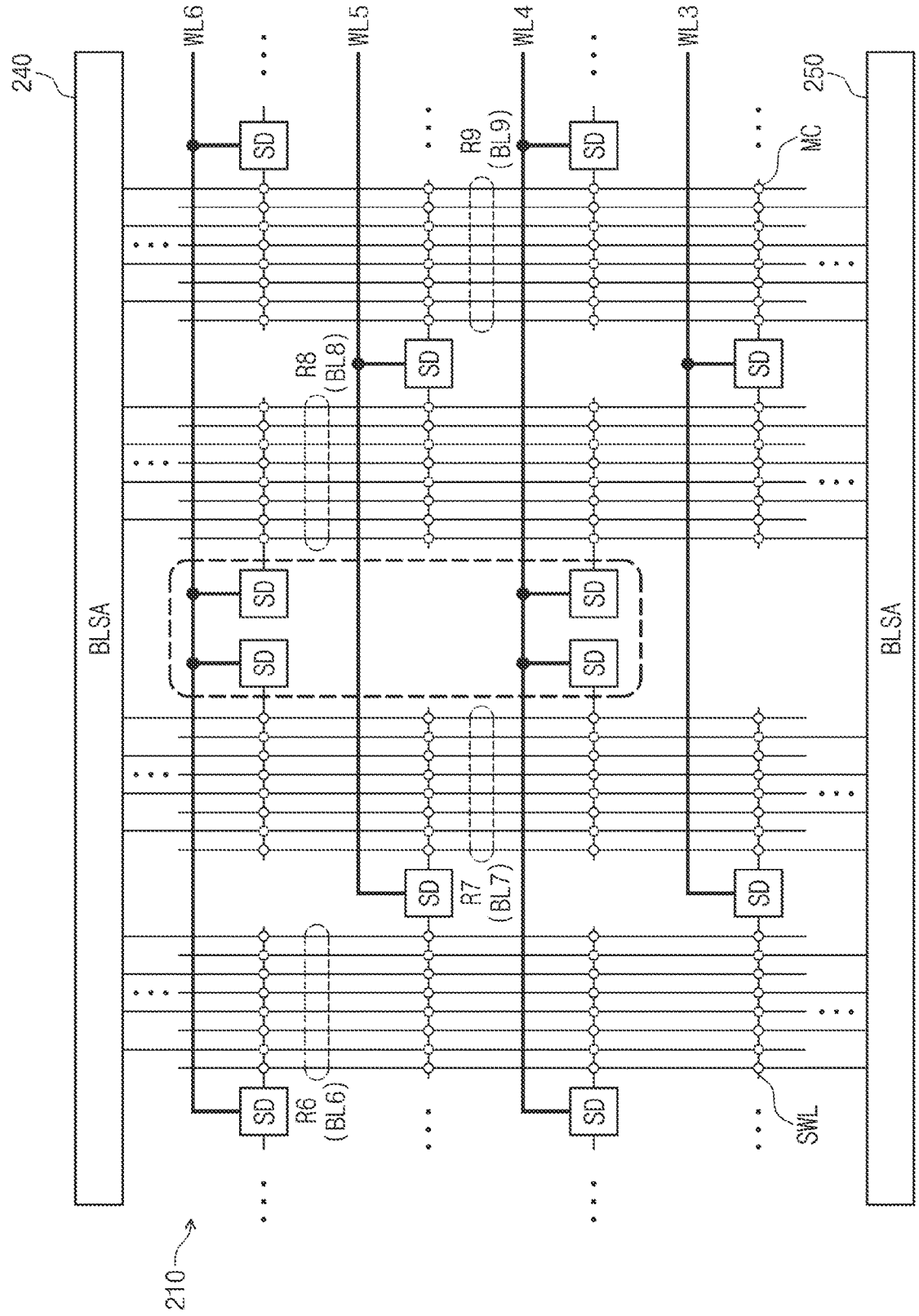
FIG. 12 is a conceptual diagram illustrating one possible structure for supporting error-independent coverages or independent sections with regard to a row-dependent error.

FIG. 12 is a conceptual diagram illustrating, in relevant portion, memory cell array supporting error-independent coverages and/or independent sections with regard to row-dependent error(s).

Referring to FIGS. 1, 2, 3 and 12, in the 7-th region R7 and the 8-th region R8, respectively corresponding to the seventh burst length BL7 and the eighth burst length BL8, the sub-word line drivers SD may be provided independent of each other. That is, the sub-word lines SWL of the 7-th region R7 may be driven independent of the sub-word lines SWL of the 8-th region R8.

Referring to the comparative example of FIG. 4, a memory cell array structure wherein a sub-word line driver is shared between two regions may result in an error associated with a sub-word line driver SD shared by the 7-th region R7 and the 8-th region R8 causing error(s) in both the 7-th region R7 and the 8-th region R8. In contrast, in the memory cell array structure of FIG. 12, even though an error occurs at one of the sub-word line drivers SD associated with the 0-th to 7-th regions R0 to R7, the error will not affect the 8-th to 15-th regions R8 to R15. Likewise, an error occurring in one of the sub-word line drivers SD associated with the 8-th to 15-th regions R8 to R15 will not result in an error affecting the 0-th to 7-th regions R0 to R7.

Accordingly, the 0-th to 7-th regions R0 to R7 and the 8-th to 15-th regions R8 to R15 are independent sections with regard to a row-dependent error. In other words, the 0-th to 7-th burst lengths BL0 to BL7 and the 8-th to 15-th burst lengths BL8 to BL15 of a memory block provide two (2) error-independent coverages.

Figure 13:
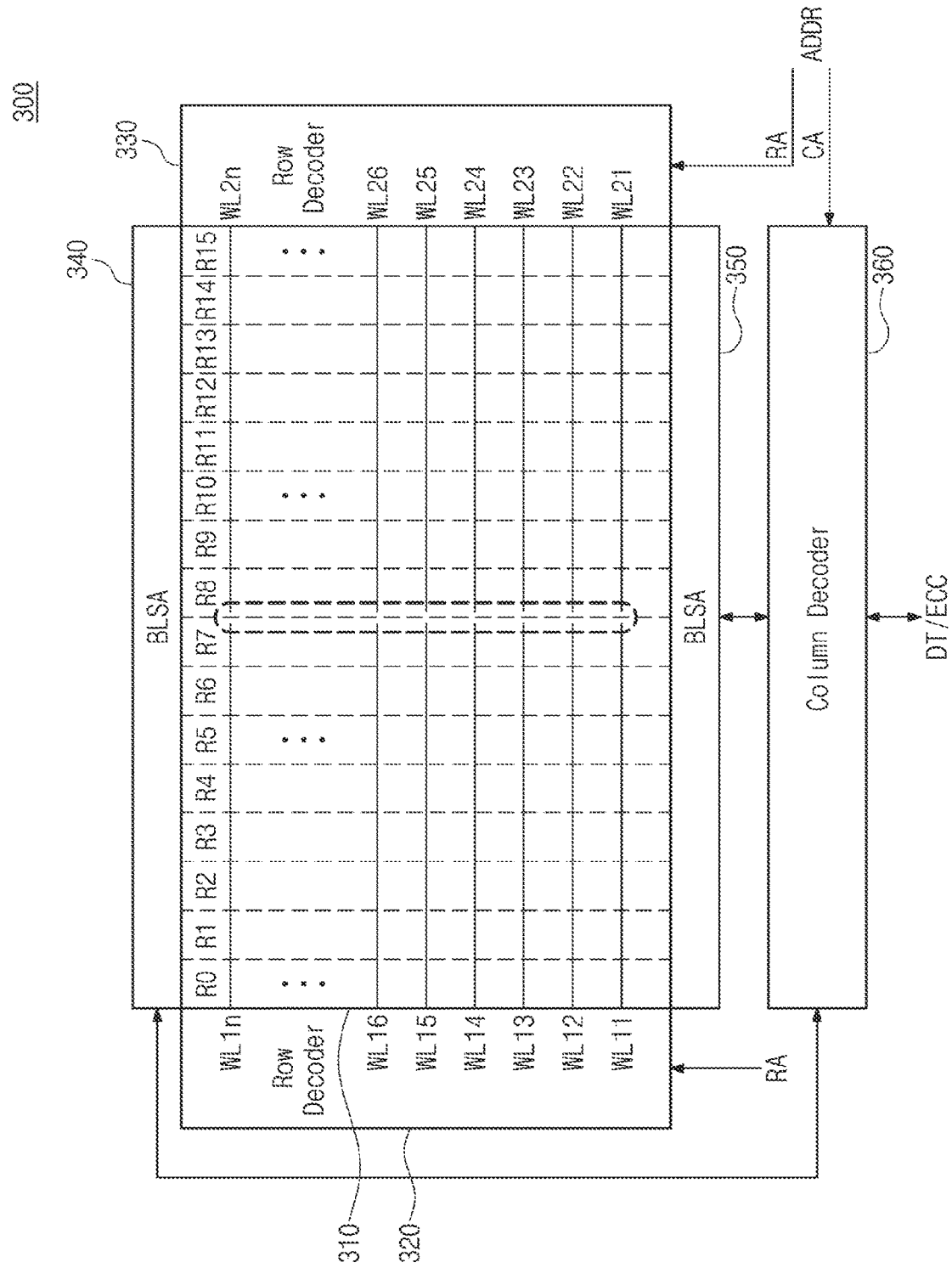
FIG. 13 is a block diagram illustrating one example of a bank having a structure for supporting error-independent coverages or independent section with regard to a row-dependent error.

FIG. 13 is a conceptual diagram illustrating an example of a bank 300 having a structure that supports multiple, error-independent coverages or independent sections with regard to a row-dependent error. Referring to FIGS. 1, 2, and 13, the bank 300 may include a memory cell array 310, a first row decoder 320, a second row decoder 330, a first bit line sense amplifier 340, a second bit line sense amplifier 350 and a column decoder 360.

Here, the structure and operation of the bank 300 may generally be the same as the bank 200 of FIG. 3, except that both the first row decoder 320 and the second row decoder 330 are provided.

As a result of this structure, the first row decoder 320 may be connected with 11-th to 1n-th word lines WL11 to WL1n, wherein the 11-th to 1n-th word lines WL11 to WL1n may be connected with memory cells of the 0-th to 7-th regions R0 to R7. In like manner, the second row decoder 330 may be connected with 21-th to 2n-th word lines WL21 to WL2n, wherein the 21-th to 2n-th word lines WL21 to WL2n may be connected with memory cells of the 8-th to 15-th regions R8 to R15.

Figure 14:
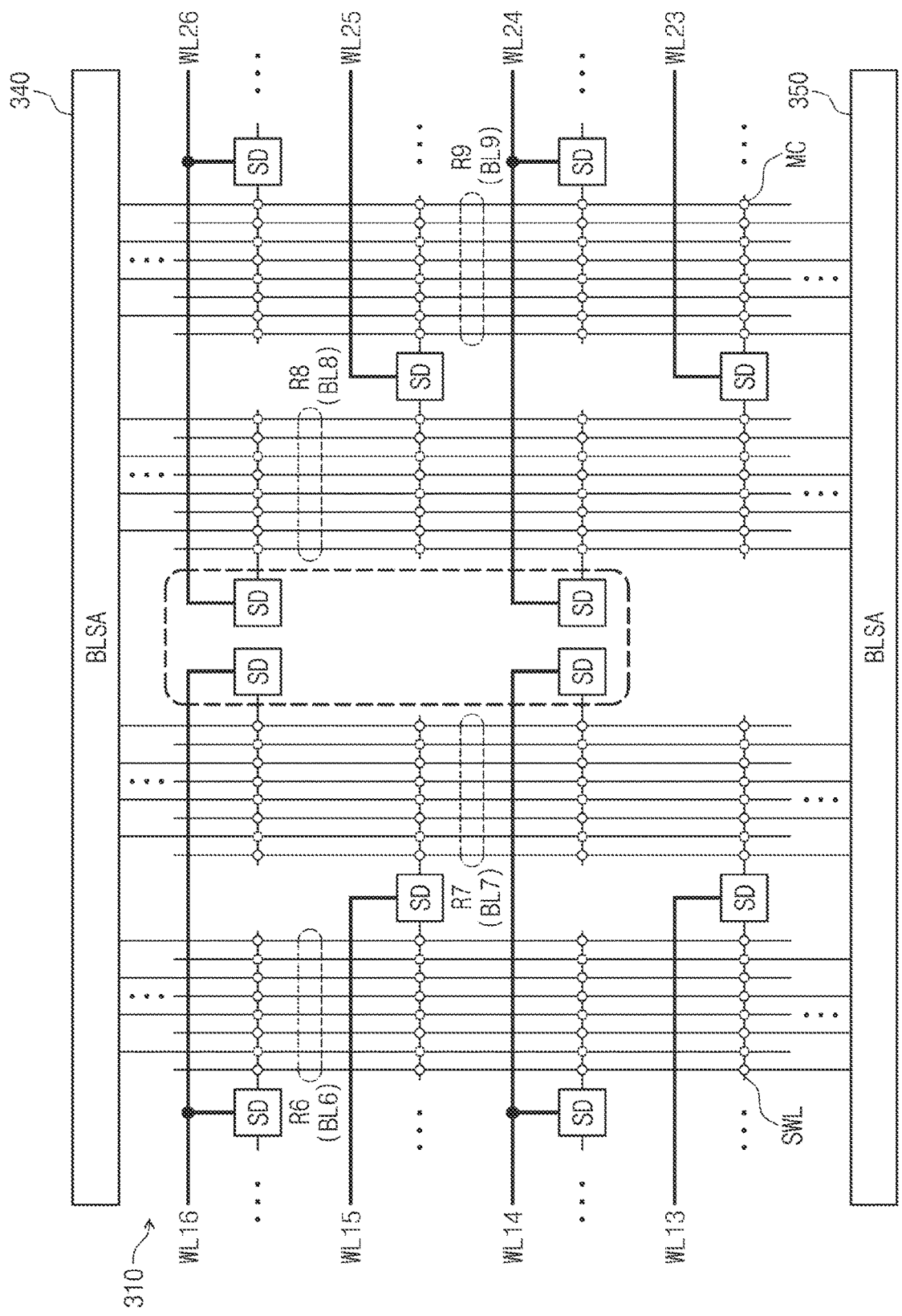
FIG. 14 is a conceptual diagram further illustrating the memory cell array of FIG. 13.

FIG. 14 is a conceptual diagram further illustrating in relevant portion the memory cell array 310 of FIG. 13. Referring to FIGS. 1, 2, 13, and 14, (and as indicated by a bold dotted line), the 13-th to 16-th word lines WL13 to WL16 and the 23-th to 26-th word lines WL23 to WL26 may be electrically and physically isolated between the 7-th region R7 and the 8-th region R8. Accordingly, the sub-word line drivers SD in the 7-th region R7 and the 8-th region R8 are not shared.

In this regard, the 11-th to 1n-th word lines WL11 to WL1n (e.g., a first set of word lines) may pass through a first section including the 0-th to 7-th regions R0 to R7, yet may not pass through a second section including the 8-th to 15-th regions R8 to R15. Further, the 21-th to 2n-th word lines WL21 to WL2n (e.g., a second set of word lines) may pass through the second section including the 8-th to 15-th regions R8 to R15, yet may not pass through the first section including the 0-th to 7-th regions R0 to R7.

Referring to FIGS. 3, 12, 13 and 14 and as a result of the structure of the illustrated embodiments of the inventive concept, an error associated with the sub-word line driver SD belonging to the first section including the 0-th to 7-th regions R0 to R7 will not affect the 8-th to 15-th regions R8 to R15 of the second section. In like manner, an error associated with the sub-word line driver SD in the 8-th to 15-th regions R8 to R15 will not affect the 0-th to 7-th regions R0 to R7. Additionally, an error resulting from a fault occurring in the 11-th to 1n-th word lines WL11 to WL1n, will not affect the 8-th to 15-th regions R8 to R15, and an error resulting from a fault occurring in the 21-th to 2n-th word lines WL21 to WL2n, will not affect the 0-th to 7-th regions R0 to R7. Accordingly, error-independent coverages may also be provided with regard to faults occurring at the word line level, as well as faults occurring at the sub-word line driver level. In addition, faults associated with the first row decoder 320 will not result in faults associated with the second row decoder 330, and faults associated with the second row decoder 330 will not result in faults associated with the first row decoder 320. Accordingly, error-independent coverages may be provided with regard to fault at the row decoder level.

Figure 15:
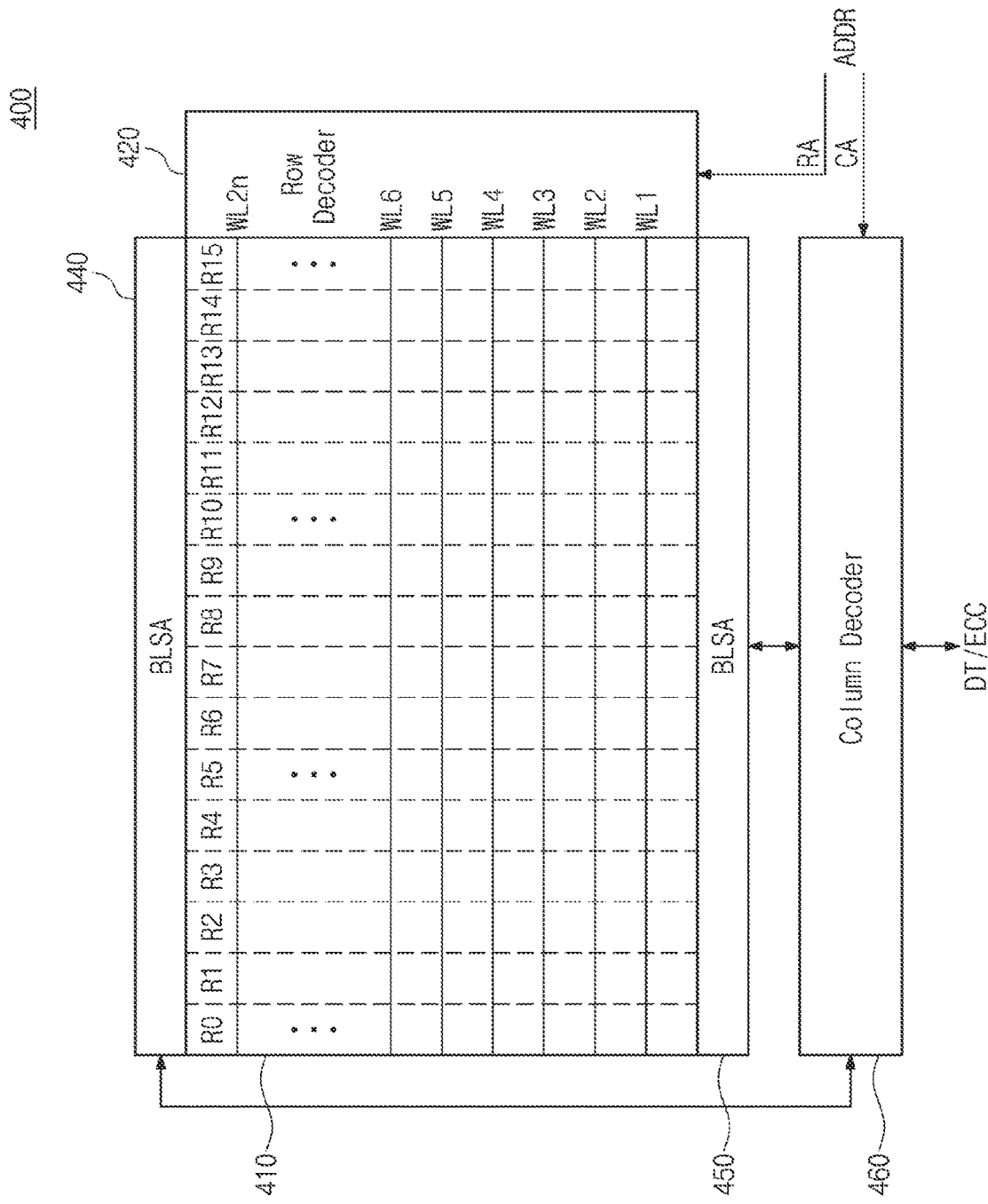
FIG. 15 is a block diagram illustrating an example of a bank having a structure for supporting error-independent coverages or independent sections with regard to a row-dependent error.

FIG. 15 is a conceptual diagram illustrating an example of a bank 400 having a structure that supports error-independent coverages or independent sections with regard to a row-dependent error. Referring to FIGS. 1, 2, and 15, the bank 400 may include a memory cell array 410, a row decoder 420, a first bit line sense amplifier 440, a second bit line sense amplifier 450, and a column decoder 460.

Here, the structure and operation of the bank 400 may be the same as the bank 200 of FIG. 3, except the number of word lines WL1 to WL2n connected with the row decoder 420 has been doubled.

Figure 16:
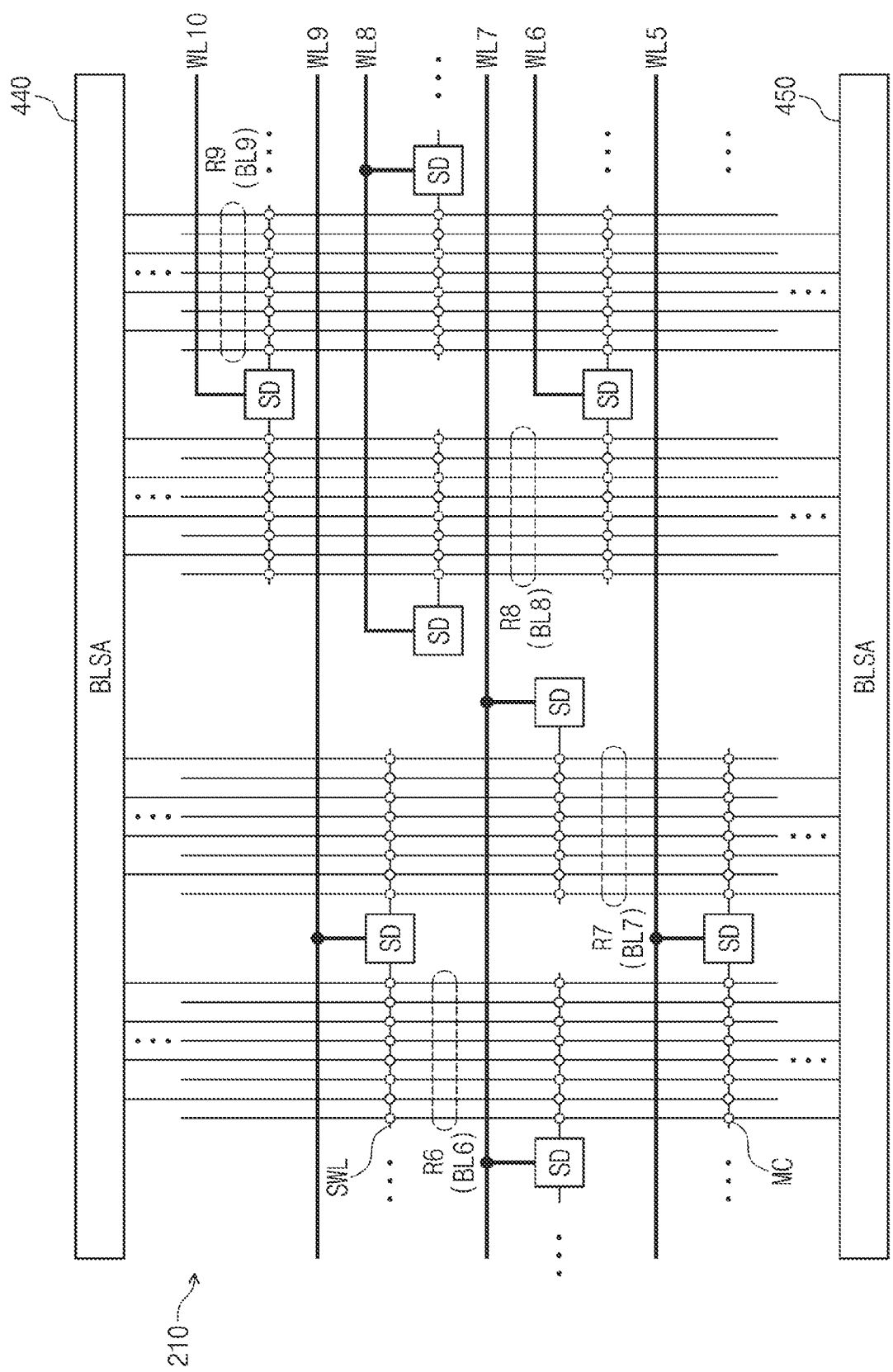
FIG. 16 is a conceptual diagram further illustrating the memory cell array of FIG. 15.

FIG. 16 is a conceptual diagram further illustrating in relevant portion the memory cell array 410 of FIG. 15. Referring to FIGS. 1, 2, 15, and 16, the first to 2n-th word lines WL1 to WL2n may be connected in turn with memory cells of the first section including the 0-th to 7-th regions R0 to R7 and memory cells of the second section including the 8-th to 15-th regions R8 to R15.

In some embodiments, odd-numbered word lines including the fifth word line WL5, the seventh word line WL7, and the ninth word line WL9 may be connected with the memory cells of the first section including the 0-th to 7-th regions R0 to R7. Thus, the odd-numbered word lines may pass through the second section to reach the first section. Analogously, even-numbered word lines including the sixth word line WL6, the eighth word line WL8, and the tenth word line WL10 may be connected with the memory cells of the second section including the 9-th to 15-th regions R8 to R15.

As described with reference to FIG. 12, and as a result of the structures described in relation to FIGS. 15 and 16, an error occurring in the sub-word line driver SD belonging to the first section including the 0-th to 7-th regions R0 to R7 will not affect the 8-th to 15-th regions R8 to R15 of the second section. Further, an error occurring in the sub-word line driver SD belonging to the second section including the 8-th to 15-th regions R8 to R15 will not affect the 0-th to 7-th regions R0 to R7 of the first section. In addition, an error associated with a fault occurring in an odd-numbered word line, will not affect the 8-th to 15-th regions R8 to R15, and an error associated with a fault occurring in an even-numbered word line, will not affect the 0-th to 7-th regions R0 to R7. Accordingly, error-independent coverages may be provided with regard to faults at a word line level, as well as faults at a sub-word line driver level.

Figure 17:
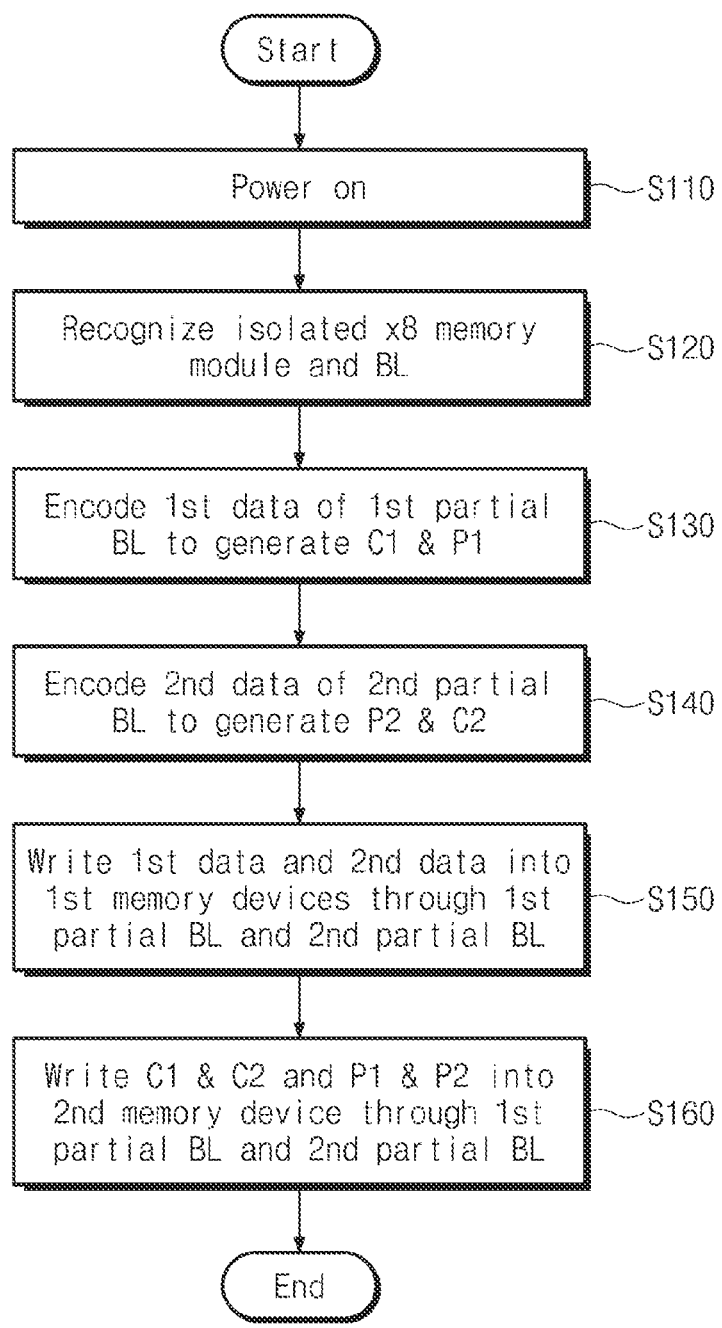
FIG. 17 is a flowchart summarizing in one example a method of operating the computing system of FIG. 1 according to embodiments of the inventive concept.

FIG. 17 is a flowchart summarizing in one example an operating method for the computing system 1000 of FIG. 1. Referring to FIGS. 1 and 17, the memory controller 1211 may detect a power-on (S110). The memory controller 1211 may then recognize an isolated x8 memory module operating according to a defined burst length BL (S120). For example, the memory controller 1211 may receive information from a serial presence detect (SPD) of the memory module 1100 indicating the properties of the isolated x4 memory module as well as its burst length BL.

The isolated x8 memory module may be a memory module that supports two or more error-independent coverages with respect to the burst length BL, as described by way of examples illustrated in FIGS. 9 to 16 (e.g., two or more error-independent coverages with regard to a row-dependent error) and based on memory devices receiving or transmitting data DT or the error correction code ECC via eight (8) data signals (x8).

The memory controller 1211 may perform error correction encoding on first data DT1 corresponding to a first partial (e.g., a first half) burst length of the whole burst length BL to generate the first cyclic redundancy code C1 and the first parity P1 (S130). Additionally, the memory controller 1211 may perform error correction encoding on the second data DT2 corresponding to a second partial (e.g., a second half) burst length of the whole burst length BL to generate the second cyclic redundancy code C2 and the second parity P2 (S140).

The memory controller 1211 may write the first data DT1 and the second data DT2 to first memory devices (e.g., the first memory devices for data 1121 to 1124) during the first partial burst length and the second partial burst length (S150).

The memory controller 1211 may write the first cyclic redundancy code C1, the second cyclic redundancy code C2, the first parity P1, and the second parity P2 to a second memory device (e.g., the first memory device for ECC 1125) during the first partial burst length and the second partial burst length.

Two or more of the foregoing operating method steps (e.g., S110 to S160) may be performed in, wholly or partially, in parallel for the second memory devices 1126 to 1130 using the second channel CH2, as well as the first channel CH1.

Figure 18:
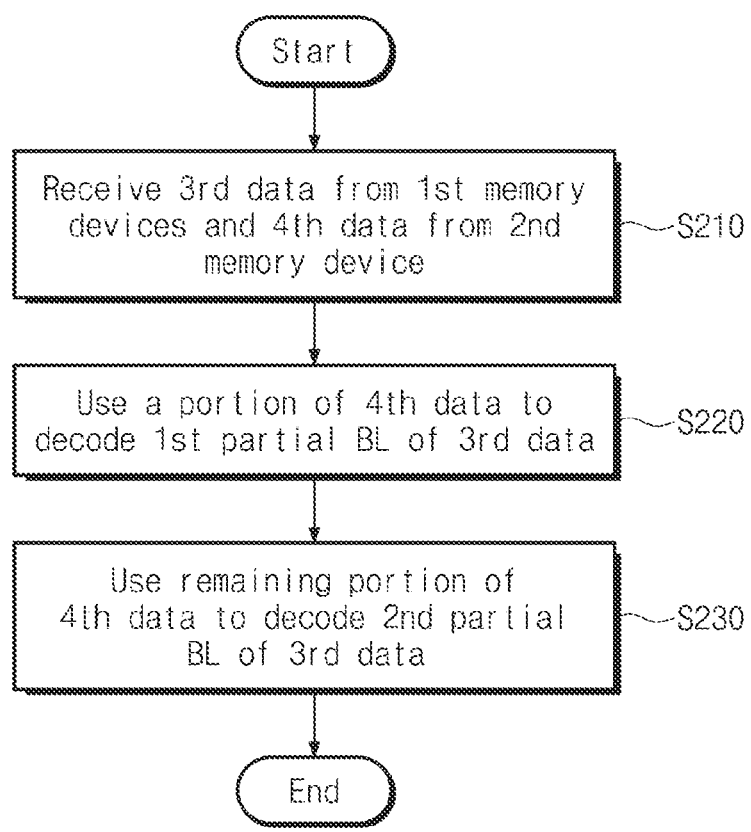
FIG. 18 is a flowchart summarizing in one example a read operation that may be performed by the memory module of FIG. 1 according to embodiments of the inventive concept.

FIG. 18 is another flowchart summarizing in one example a read operation that may be performed by the computing system 1000 of FIG. 1. Referring to FIGS. 1 and 18, the memory controller 1211 may receive third data from first memory devices (e.g., the first memory devices for data 1121 to 1124) and fourth data from a second memory device (e.g., the first memory device for ECC 1125) (S210).

The memory controller 1211 may then perform error correction decoding on a first partial burst length of the third data using a portion of the fourth data (e.g., first cyclic redundancy code C1 and first parity P1) (S220), and the memory controller 1211 may perform error correction decoding on a second partial burst length of the third data using the remaining portion of the fourth data (e.g., the second cyclic redundancy code C2 and second parity P2) (S230).

Here, two or more of the read operation steps (e.g., S210 to S230) may be performed, wholly or partially, in parallel on the second memory devices 1126 to 1130 using the second channel CH2, as well as the first channel CH1.

Figure 19:
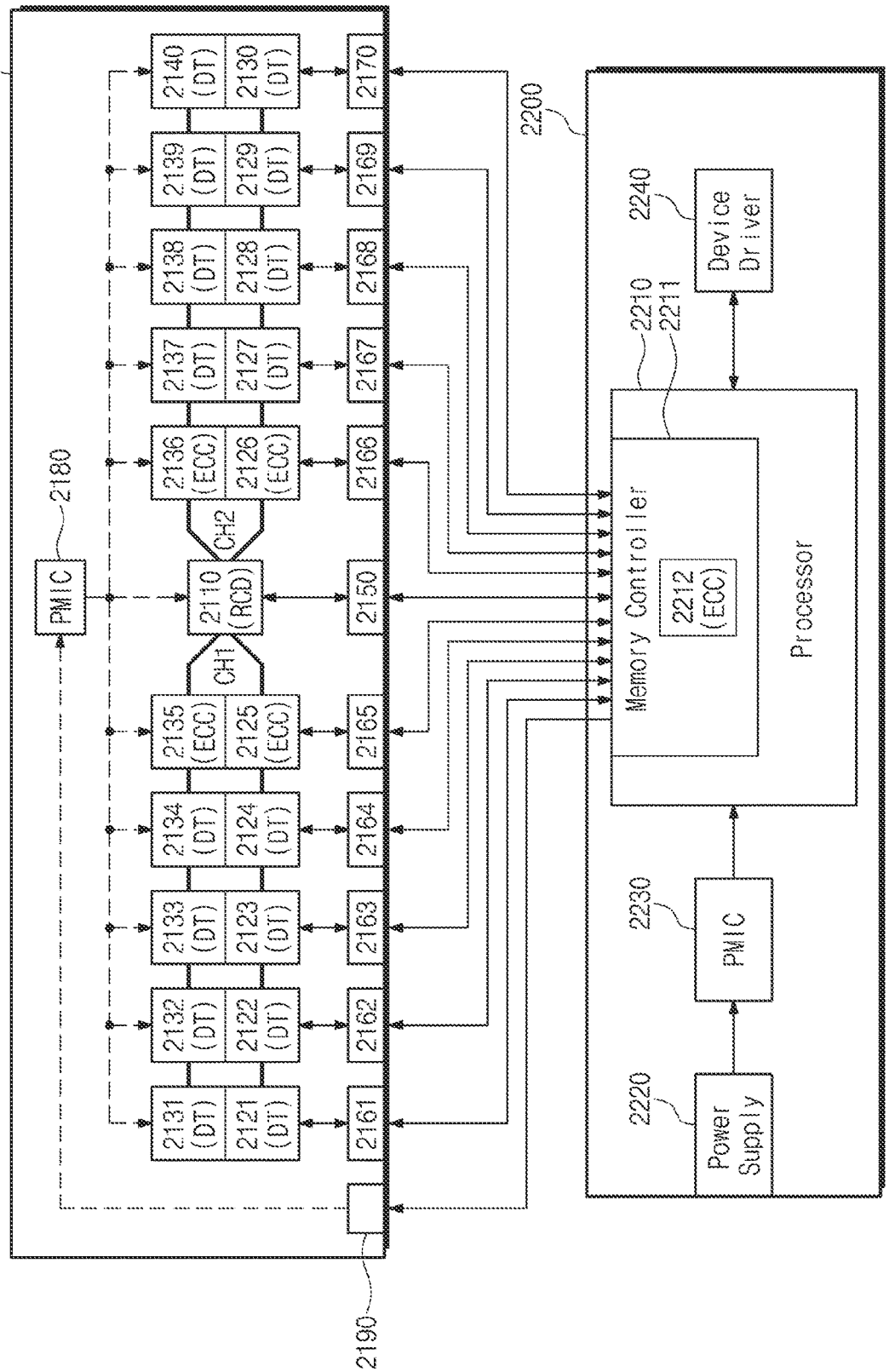
FIG. 19 is a block diagram illustrating a computing system according to embodiments of the inventive concept.

FIG. 19 is a block diagram illustrating a computing system 2000 according to embodiments of the inventive concept. Referring to FIG. 19, the computing system 2000 may include a memory module 2100 and an external host device 2200 of the memory module 2100.

The memory module 2100 may include a driver 2110, first memory devices 2121 to 2125 and 2131 to 2135, second memory devices 2126 to 2130 and 2136 to 2140, a driver connector 2150, first memory connectors 2161 to 2165, second memory connectors 2166 to 2170, a power management circuit 2180, and a power connector 2190.

A configuration and operation of the memory module 2100 may be the same as the memory module 1100 of FIG. 1, except that the number of first memory devices 2121 to 2125 and 2131 to 2135 of the first channel CH1 is 10 and the number of second memory devices 2126 to 2130 and 2136 to 2140 of the second channel CH2 is increased from 5 to 10.

In the illustrated embodiment of FIG. 19, each of the first memory devices 2121 to 2125 and 2131 to 2135 and the second memory devices 2126 to 2130 and 2136 to 2140 may be implemented such that the number of memory cells MC connected with one sub-word line SWL is four (4).

Thus, each of the first memory devices 2121 to 2125 and 2131 to 2135 and the second memory devices 2126 to 2130 and 2136 to 2140 may be an x4 memory device that communicates four (4) data signals DQ (e.g., 4 bits) with a memory controller 2211. Connectors of eight (8) data signals DQ used by the x8 memory device of FIG. 1 may be divided into two, vertically stacked memory devices.

The external host device 2200 may include a processor 2210, a power supply 2220, a host power management circuit 2230, and a device driver 2240. The processor 2210 may include the memory controller 2211. The memory controller 2211 may include an error correction circuit 2212. The configuration and operation of the external host device 2200 may be similar to that of the external host device 1200 described with reference to FIG. 1.

FIG. 20 is a conceptual diagram illustrating an example of a data block that may be used in relation to the first memory devices 2121 to 2125 and 2131 to 2135 and the second memory devices 2126 to 2130 and 2136 to 2140 of the memory module 2100 of FIG. 19. Referring to FIGS. 19 and 20, a data block may include 512 bits corresponding to first to fourth data signals DQ1 to DQ4 and the 0-th to 15-th burst lengths BL0 to BL15.

The first memory devices for data 2121 to 2124 and 2131 to 2134 and the second memory devices for data 2127 to 2130 and 2137 to 2140 may store the data DT and may communicate the data DT with the memory controller 2211. The first memory devices for ECC 2125 and 2135 and the second memory devices for ECC 2126 and 2136 may store the error correction code ECC including cyclic redundancy code "C" and parity "P", and may communicate the error correction code ECC with the memory controller 2211.

Figure 21:
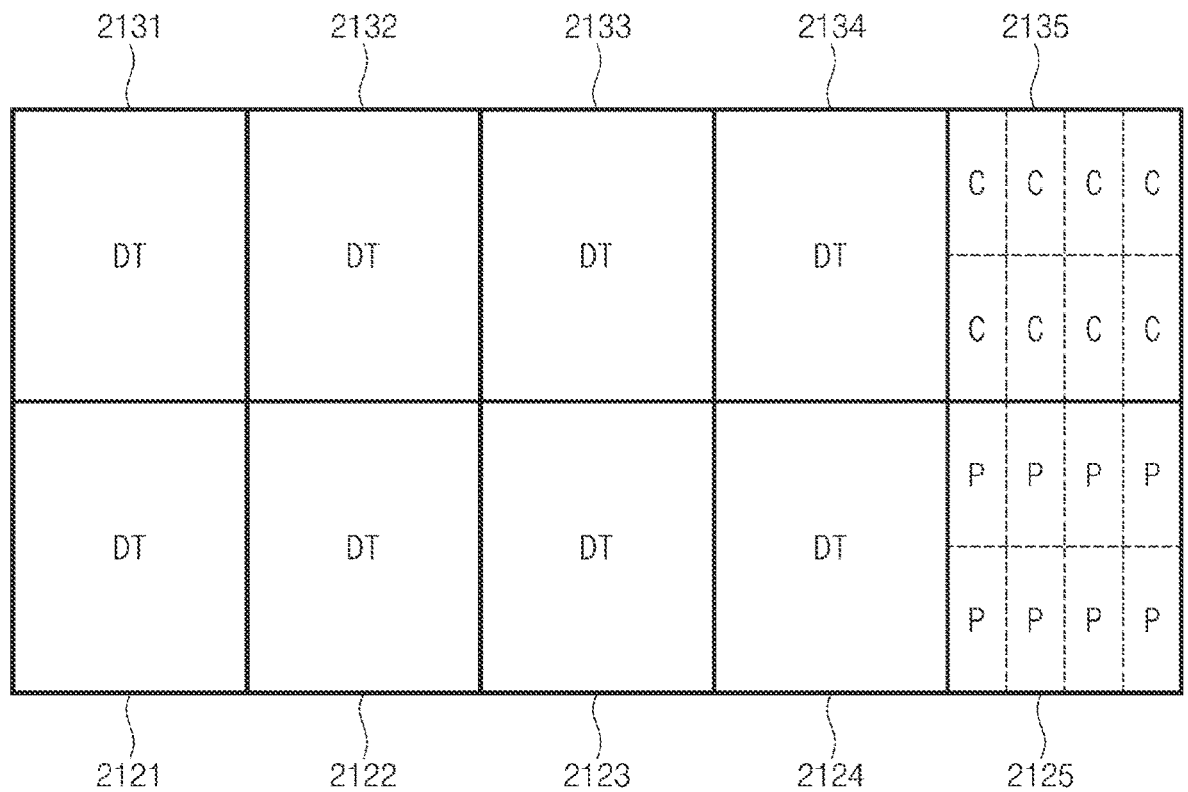

FIG. 21 is a conceptual diagram illustrating in one example of data blocks including the data DT, the cyclic redundancy code "C" and the parity "P" of the first memory devices 2121 to 2125 and 2131 to 2135 of one channel (e.g., the first channel CH1) of the memory module 2100. Data blocks of the second memory devices 2126 to 2130 and 2136 to 2140 of the second channel CH2 may be the same as those described with reference to FIG. 21, except for the respective locations where the data blocks.

Referring to FIGS. 19, 20 and 21, the first memory devices 2121 to 2125 and 2131 to 2135 of the first channel CH1 may communicate with the external host device 2200 in units of eight data blocks including the data DT and two data blocks including the cyclic redundancy code "C" and the parity "P".

As described with reference to FIG. 11, two (2), error-independent memory devices for ECC may be provided with respect to eight (8), error-independent memory devices for data. Accordingly, the RAS coverage of the memory module 2100 may be the SDDC.

FIG. 22 is a conceptual diagram illustrating on one example a data block for data providing two or more, error-independent coverages. Referring to FIGS. 19, 20, 21 and 22, and as described with reference to FIGS. 12, 13, 14, 15, and 16, two or more error-independent coverages may be provided based on two or more independent sections with regard to a row-dependent error.

The first coverage corresponding to the 0-th to 7-th burst lengths BL0 to BL7 may include the first data DT1. The second coverage corresponding to the 8-th to 15-th burst lengths BL8 to BL15 may include the second data DT2.

FIG. 23 is a conceptual diagram illustrating in one example a data block for ECC providing two or more error-independent coverages. Referring to FIGS. 19, 20, 21, 22 and 23, and as described with reference to FIGS. 12, 13, 14, 15 and 16, two or more error-independent coverages may be provided based on two or more independent sections with regard to a row-dependent error.

The first coverage corresponding to the 0-th to 7-th burst lengths BL0 to BL7 may include the first cyclic redundancy code C1 and/or the first parity P1 corresponding to the first data DT1. The second coverage corresponding to the 8-th to 15-th burst lengths BL8 to BL15 may include the second cyclic redundancy code C2 and/or the second parity P2 corresponding to the second data DT2.

Figure 24:
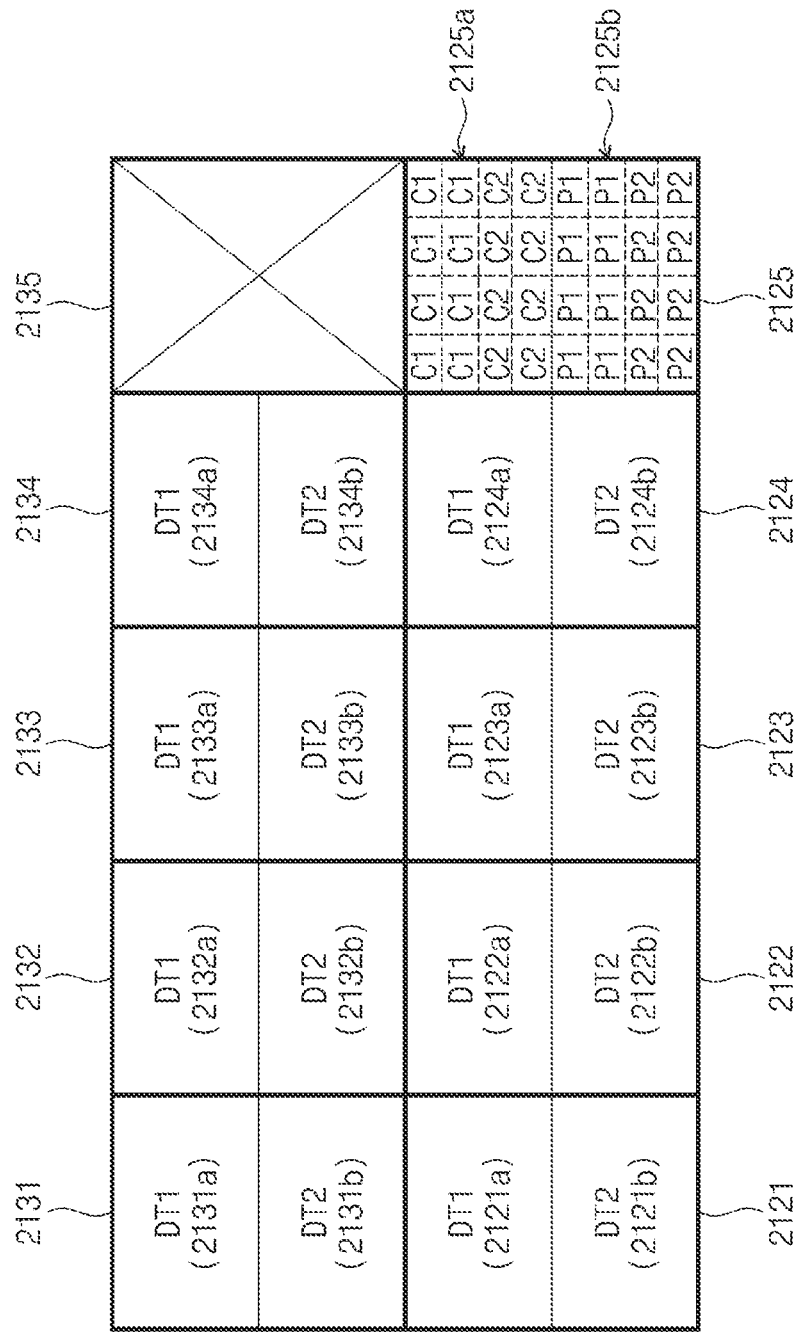

FIG. 24 is a conceptual diagram illustrating in one example data blocks of the first memory devices 2121 to 2125 and 2131 to 2135 associated with one channel (e.g., the first channel CH1) of the memory module 2100. Data blocks of the second memory devices 2126 to 2130 and 2136 to 2140 of the second channel CH2 may be the same as those described with reference to FIG. 24, except for the respective locations of the data blocks.

Referring to FIGS. 22, 23 and 24, each of data blocks for data belonging to the first memory devices for data 2121 to 1125 and 2131 to 1135 may include the first data DT1 and the second data DT2 for each of first coverages 2121a to 2124a and 2131a to 2134a and second coverages 2121b to 2124b and 2131b to 2134b.

Compared to the data blocks of FIG. 21, the range of an error-independent space decreases from a memory device level to a coverage level. Accordingly, a range over which the memory controller 2211 may perform error correction encoding and decoding may decrease. As described with reference to FIG. 11, the amount of cyclic redundancy code and parity necessary to the memory controller 2211 to maintain a desired level of error correction performance may be halved.

As illustrated in FIG. 24, the amount of first and second cyclic redundancy code C1 and C2 and the amount of first and second parity may be halved, as compared with the illustrated example of FIG. 21. Accordingly, even though one of the first memory devices for ECC 2125 and 2135 is removed from the memory module 2100, the RAS of the memory module 2100 may maintain the SDDC.

In a state where the RAS of the SDDC is maintained, the memory module 2100 may remove one of the first memory devices 2121 to 2125 and 2131 to 2135 and may remove one of the second memory devices 2126 to 2130 and 2136 to 2140. Accordingly, cost of the memory module 2100 may decrease in a state where the performance of the memory module 2100 is maintained. Also, power consumption of the memory module 2100 may decrease.

Connectors for the first memory device removed and data signals and data strobe signals assigned to the first memory device removed may be used for the driver 2110 to transmit signals for informing the external host device 2200 of information about a status of the memory module 2100 or to transmit any other necessary signals. Accordingly, the flexibility of the memory module 2100 may be improved.

The memory module 1100 according to embodiments of the inventive concept may include x8 memory devices and may expand the RAS from the SECDED to the SDDC without the reduction of bandwidth or the reduction of performance. Also, the memory module 2100 according to an embodiment of the inventive concept may include x4 memory devices and may maintain the RAS at the SDDC without the reduction of bandwidth or the reduction of performance, in a state where one memory device is used to store the error correction code ECC.

Figure 25:
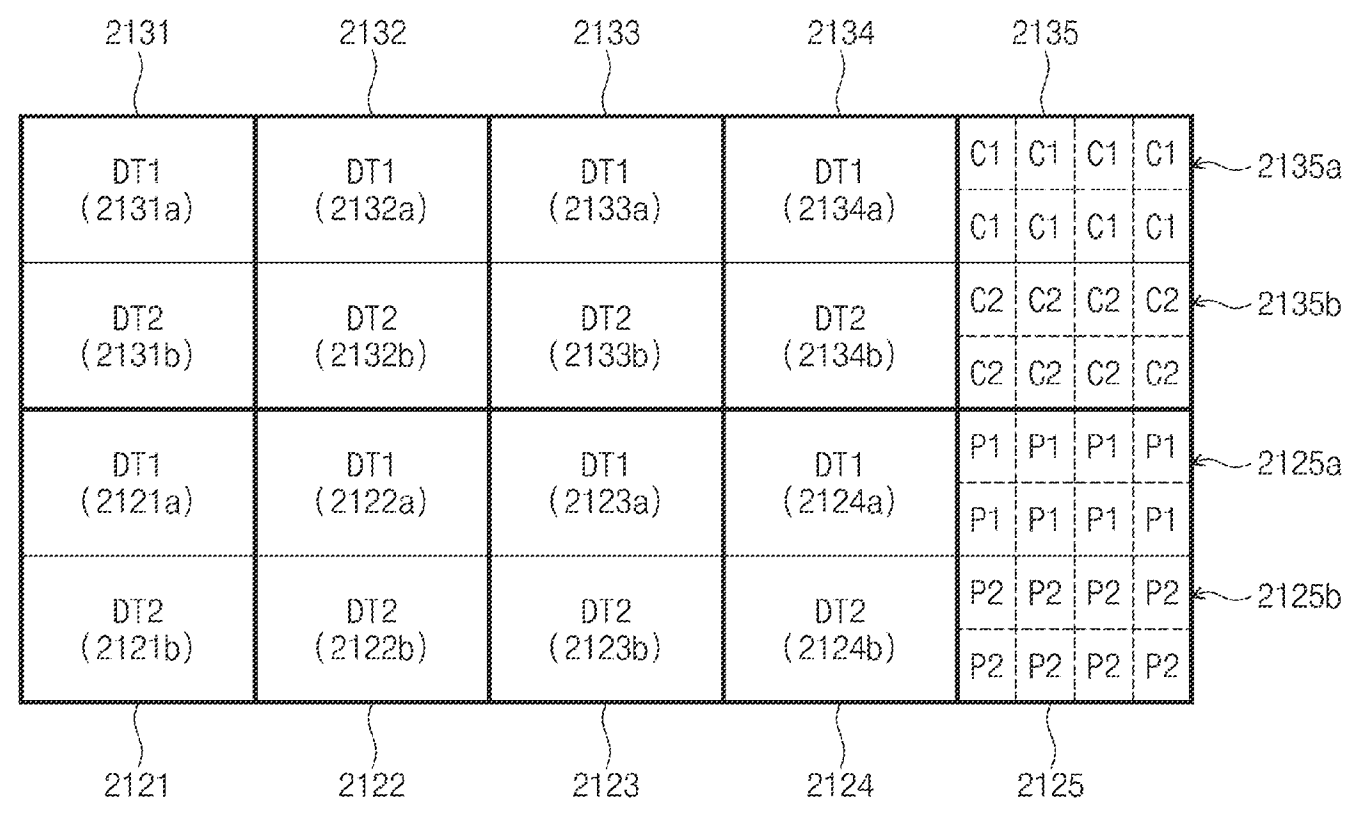

FIG. 25 is a conceptual diagram illustrating in another example, data blocks of the first memory devices 2121 to 2125 and 2131 to 2135 associated with one channel (e.g., the first channel CH1) of the memory module 2100. Data blocks of the second memory devices 2126 to 2130 and 2136 to 2140 of the second channel CH2 may be the same as those described with reference to FIG. 24, except for the respective locations of the data blocks.

Referring to FIGS. 19, 22, 23, and 25, each of data blocks for data belonging to the first memory devices for data 2121 to 1125 and 2131 to 1135 may include the first data DT1 and the second data DT2 for each of the first coverages 2121a to 2124a and 2131a to 2134a and the second coverages 2121b to 2124b and 2131b to 2134b.

Compared to the data blocks of FIG. 21, a range of an error-independent space decreases from a memory device level to a coverage level. Accordingly, a range over which the memory controller 2211 may perform error correction encoding and decoding may decrease. As described with reference to FIG. 11, the amount of cyclic redundancy code and parity necessary to the memory controller 2211 to maintain a performance of error correction may be halved.

As illustrated in FIG. 25, the amount of first and second cyclic redundancy code C1 and C2 and the amount of first and second parity may be maintained to be the same as the illustrated example of FIG. 21. Accordingly, the performance of error correction of the memory module 2100, and the RAS may be improved compared to the example of FIG. 21.

The foregoing embodiments describe some locations within a data block at which cyclic redundancy code "C" and parity "P" may be stored. However, such locations may vary with design, and the inventive concept is not limited to only the illustrated examples. In some embodiments, the arrangement and location of cyclic redundancy code "C" and parity "P" stored in a data block may be randomly determined by the external host device 1200.

In the foregoing embodiments, components according to the inventive concept have been described in terms of "first", "second", "third", and the like. However, the terms "first", "second", "third", and the like may be used to distinguish components from each other and do not limit the inventive concept. For example, the terms "first", "second", "third", and the like do not involve an order or a numerical meaning of any form.

In the above embodiments, components according to embodiments of the inventive concept are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to embodiments of the inventive concept, a memory device has been described as including sections whose row-dependent errors are independent of each other. Accordingly, a memory device having a structure supporting a function for correcting an error is provided. Also, the memory device including sections whose row-dependent errors are independent of each other may provide two or more error-independent coverages with regard to data corresponding to one burst length. Accordingly, a memory module having an improved error correction function or capable of reducing the amount of resource necessary for error correction is provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:
1. A memory device comprising:
banks; and
a peripheral circuit configured to receive a command and an address from an external host device, transfer the command and the address to the banks, and communicate data between the external host device and the banks, wherein each of the banks includes;
a memory cell array including memory cells,
a row decoder connected with the memory cells through word lines,
bit line sense amplifiers connected with the memory cells through bit lines including first bit lines and second bit lines, and
a column decoder configured to connect the bit line sense amplifiers with the peripheral circuit,
the memory cell array includes a first section connected with the first bit lines and a second section connected with the second bit lines, and
the first section and the second section are independent of each other with regard to a row-dependent error.

2. The memory device of claim 1, wherein the memory cell array includes of regions corresponding to a burst length, and
the regions are divided among the first section and the second section.

3. The memory device of claim 2, wherein the burst length is 16.

4. The memory device of claim 3, wherein the first section includes 0-th to 7-th regions and the second section includes 8-th to 15-th regions.

5. The memory device of claim 1, wherein the memory cells are connected with sub-word lines, the sub-word lines are connected with the word lines through sub-word line drivers, and the first section and the second section are connected to different sub-word lines and different sub-word line drivers.

6. The memory device of claim 5, wherein each of the word lines is commonly connected with a sub-word line driver of the first section and a sub-word line driver of the second section.

7. The memory device of claim 5, wherein the column decoder simultaneously transmits data from two or more memory cells connected with a sub-word line selected from the sub-word lines to the peripheral circuit.

8. The memory device of claim 1, wherein the row decoder connected with the memory cells through word lines comprises:
a first row decoder connected with first memory cells belonging to the first section through first word lines; and
a second row decoder connected with second memory cells belonging to the second section through second word lines.

9. The memory device of claim 8, wherein the first memory cells are electrically isolated from the second word lines, and the second memory cells are electrically isolated from the first word lines.

10. The memory device of claim 8, wherein the first word lines do not pass through the second section, and the second word lines do not pass through the first section.

11. The memory device of claim 1, wherein the word lines include first word lines and second word lines, different from the first words lines,
the memory cells include first memory cells included in the first section and connected to the first word lines, and second memory cells different from the first memory cells included in the second section and connected to the second word lines.

12. The memory device of claim 11, wherein the first memory cells are electrically isolated from the second word lines, and the second memory cells are electrically isolated from the first word lines.

13. The memory device of claim 11, wherein the second word lines pass through the first section.

14. A memory module comprising:
first memory devices;
a second memory device;
a driver configured to receive a command and an address from an external host device, and transfer the command and the address to the first memory devices and the second memory device; and
a power management circuit configured to receive an external power signal from the external host device, generate an internal power signal from the external power signal, and provide the internal power signal to at least one of the first memory devices, the second memory device and the driver,
wherein each of the first memory devices and the second memory device is configured to communicate data with the external host device in accordance with a burst length, and
each of the first memory devices and the second memory device respectively provides two error-independent coverages with regard to the burst length.

15. The memory module of claim 14, wherein the first memory devices include four (4) memory devices configured to store data received from the external host device, and
the second memory device is configured to store cyclic redundancy code and parity for correcting an error in the data stored in the four (4) memory devices.

16. The memory module of claim 15, wherein each of the first memory devices and the second memory device is configured to simultaneously transmit eight bits of data.

17. The memory module of claim 15, wherein the two error-independent coverages of the second memory device include a first coverage and a second coverage,
the two error-independent coverages of each of the first memory devices include a third coverage and a fourth coverage,
a first portion of the first coverage and a first portion of the second coverage among the cyclic redundancy code and the parity provides single device data correction (SDDC) with respect to the third coverage for each of the first memory devices, and
a second portion of the first coverage and a second portion of the second coverage among the cyclic redundancy code and the parity provides single device data correction with respect to the fourth coverage for each of the first memory devices.

18. The memory module of claim 17, wherein the first coverage and the third coverage correspond to a first portion of the burst length, and
the second coverage and the fourth coverage correspond to second portion of the burst length.

19. A memory module comprising:
eight (8) first memory devices;
a second memory device;
a driver configured to receive a command and an address from an external host device, and transfer the command and the address to the first memory devices and the second memory device; and
a power management circuit configured to receive an external power signal from the external host device, generate an internal power signal from the external power signal, and provide the internal power signal to at least one of the first memory devices, the second memory device and the driver, wherein each of the first memory devices and the second memory device is configured to communicate data with the external host device in accordance with a burst length, wherein each of the first memory devices and the second memory device provides at least two error-independent coverages with regard to the burst length, and the second memory device is configured to store cyclic redundancy code and parity for correcting an error in data stored in at least one of the eight (8) first memory devices.

20. The memory module of claim 19, wherein the burst length is 16, and each of the first memory devices and the second memory device is configured to simultaneously transmit four (4) bits.

* * * * *